(12) United States Patent
Nikawa

(10) Patent No.: US 6,593,156 B2
(45) Date of Patent: Jul. 15, 2003

(54) NON-DESTRUCTIVE INSPECTION METHOD

(75) Inventor: Kiyoshi Nikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 79 days.

(21) Appl. No.: 09/982,863

(22) Filed: Oct. 22, 2001

(65) Prior Publication Data

US 2002/0052055 A1 May 2, 2002

(30) Foreign Application Priority Data

Oct. 26, 2000 (JP) .......................................  2000-326820
Feb. 9, 2001 (JP) .......................................  2001-033928
Mar. 21, 2001 (JP) .......................................  2001-081310

(51) Int. Cl.$^7$ .......................... H01L 21/66; G01R 31/26
(52) U.S. Cl. ........................................ 438/17; 324/750
(58) Field of Search ............................ 438/14, 17, 18, 438/16; 257/48; 324/501, 512, 522, 523, 750, 765

(56) References Cited

FOREIGN PATENT DOCUMENTS

JP   10-135413   5/1998

OTHER PUBLICATIONS

K. Nikawa, "Laser–Squid Microscopy: Novel Nondestructive and Non–electrical–contact Tool for Inspection, Monitoring and Analysis of LSI–chip–electrical–defects", Oct. 2001, Microprocesses and Nanotechnology Conference, 2001 International, pp. 62–63.*

J. Beyer et al., "Magnetic detection of photogenerated currents in semiconductor wafers using superconducting quantum interference devices", Applied Physics Letters, vol. 74, No. 19, (May 10, 1999), pp. 2863–2865.

* cited by examiner

Primary Examiner—Evan Pert
(74) Attorney, Agent, or Firm—Sughrue Mion, PLLC

(57) ABSTRACT

To provide a non-destructive inspection method including: a first step of generating a laser light ranging in wavelength from 300 nm to 1,200 nm, and generating a laser beam converging into a predetermined beam diameter; a second step of predetermined electrical connection means configuring a predetermined current path for passing an OBIC current generated by an OBIC phenomenon when the laser beam is radiated onto the p-n junction and the vicinity of the p-n junction formed in the semiconductor chip to be inspected at least in the substrate including a wafer state and an installation state during the production process; a third step of scanning a predetermined area of a semiconductor chip while radiating the laser beam; a fourth step of magnetic flux detection means detecting magnetic flux induced by the OBIC current generated by the laser beam at each radiation point scanned in the third step; and a fifth step of determining whether or not there is a resistance increase defect including a disconnection defect or a leak defect including a short circuit defect in the current path including the radiation point of said semiconductor chip based on said magnetic flux detected in the fourth step.

23 Claims, 18 Drawing Sheets

US 6,593,156 B2

NON-DESTRUCTIVE INSPECTION METHOD

BACKGROUND OF THE INVENTION

1. Field of the Invention

The present invention relates to a method for carrying out a non-destructive inspection on a semiconductor chip in a wafer state, in an installation state, etc. in a production process, and more specifically to a method for detecting or inspecting a portion having a leakage including a short circuit, increasing resistance, or a disconnection.

2. Description of the Prior Art

Conventionally, such a non-destructive inspection technique has been used to detect a defective portion of a p-n junction in a non-destructive manner as part of analysis of failure and defect in a semiconductor chip.

FIG. 15 illustrates the principle of the conventional non-destructive inspection method. When a laser beam 2 is radiated onto a p-n junction 1, a pair of an electron 3 and a positive hole 4 is generated. Each of them flows in the opposite direction by the electric field of the empty layer of the p-n junction 1 and the electric field by an external power source 5. Thus, the flowing current is referred to as a current by an OBIC (optical beam inducted current) phenomenon. This OBIC current 6 is detected as a current or a variation of a current by an ammeter 7 connected in series to the p-n junction 1. FIG. 16 illustrates an example of the conventional technology of detecting a defect by an OBIC current. It shows a defect 18 promoting the recombination on the p-n junction 1 with the same configuration as in FIG. 15. When a laser beam is radiated onto a non-defect portion like a laser beam 22, an OBIC current flows just as in the case shown in FIG. 15. On the other hand, when a laser beam is radiated onto the defect 18 promoting the recombination like a laser beam 22, the recombination annihilates a pair of an electron and a positive hole if it is generated, and no OBIC current flows. Thus, the position of the defect promoting the recombination can be specified.

The OBIC phenomenon at the p-n junction is, as disclosed in Japanese Patent Publication No. 10-135413, not only used to detect a defect of the p-n junction, but also used to detect a disconnected wire in the wiring. The method is described below by referring to the side view shown in FIG. 17 and the plan view shown in FIG. 18. P-n junctions 1001, 1002, and 1003 are connected in series. The wiring is formed parallel to each of the p-n junctions. When the wiring is disconnected by a disconnection defect 1028, an OBIC current different from the currents of the other p-n junctions flows the p-n junction 1002 connected parallel to the disconnected wiring when a laser beam is radiated, thereby successfully specifying the disconnect wiring.

There is another conventional technology. As disclosed by Beyer, J. et al., Applied Physics Letter (Appl. Phys. Lett.) vol. 74, No. 19. pp. 2863-2865 (1999), a semiconductor substrate (hereinafter referred to as a raw wafer) before configuring an element as a semiconductor device is used in carrying out a non-destructive inspection to inspect the non-uniformity of the impurity density of a semiconductor substrate. FIG. 19 shows a basic configuration. When the laser beam 2 is radiated onto a raw wafer 200, a pair of the electron 3 and the positive hole 4 occurs. The pair of the electron 3 and the positive hole 4 is immediately recombined and annihilated if the impurity density in the raw wafer 200 is uniform. However, if the impurity density is not uniform, the OBIC current 6 flows. Magnetic flux 11 formed by the current is detected by a superconducting quantum interference device (hereinafter referred to as SQUID) fluxmeter 12.

There is the following problem with the above mentioned conventional technology.

In the first conventional technology, to first detect a current change, an electrical connection is required between the inspection device and a semiconductor chip, and an inspection can be carried out only after the completion of the preprocess of the production process of a semiconductor to be inspected, and after the completion of a bonding pad.

An inspection can be carried out after a bonding pad is completed, that is, after a postprocess is completed. However, in this case, there are a number of combinations for an electrical connection, and a large number of process steps and a high cost are required in preparation for the connection. The conventional technology is not effective if a currently defective portion is not electrically connected in series with an ammeter. Therefore, to carry out the inspection without fail, it is necessary to electrically connect an ammeter to all bonding pads capable of passing an OBIC current. Normally, the flow of the OBIC current is detected between two terminals as shown in FIG. 16. However, the number of combinations of two terminals increases substantially in proportion to the square of the number of bonding pads. Therefore, when the number of bonding pads increases, the number of combinations largely increases. To prepare for the connections each time the type of object chips changes, it is necessary to prepare for an exclusive jig and change the connection, thereby requiring a number of process steps and a high cost.

Furthermore, as described above, in addition to the increasing number of combinations of connections, the electrical connections of the terminals to other devices and parts also affect an inspection, thereby causing the problem that the interpretation of an observation result becomes complicated. Furthermore, the possibility that an inspection may deteriorate other devices and parts makes it considerably hard to actually carry out the inspection after the installation is completed.

The problem with the second conventional technology is that it is very hard to apply the technology as is to a semiconductor chip in view of the response speed. In the Applied Physics letter (Appl, Phys. Lett.) by Beyer, J. et al., vol. 74, No. 19, pp. 2863-2865 (1999) which is referred to as the second conventional technology in the Reference 2, an observation target is the OBIC current for a raw wafer, and the time constant is no more than 50 $\mu$s, which is described as an observation result on page 2865 in line 4.

On the other hand, the attenuation of the OBIC current transitionally generated in a semiconductor chip proceeds exceedingly fast in most cases as compared with 50 $\mu$s unless the current is led outside. The reason why the attenuation of the OBIC current transitionally generated in a semiconductor chip proceeds exceedingly fast in many cases is that the structures of the element in a semiconductor chip and the wiring are designed to be able to be operated at a high speed in many cases. Practically, a CR time constant which depends on the values of a capacitance C and a resistor R is designed to induce the maximum performance of the semiconductor chip in many cases. Therefore, the OBIC current generated in the semiconductor chip is often attenuated with the time constant. When a semiconductor chip operates at, for example, 1 GHz, the time constant has to be higher than 1 ns. To detect an OBIC current attenuating faster than 1 ns, the response frequency of the SQUID fluxmeter has to be higher than 1 GHz. From an economical viewpoint, the currently available SQUID fluxmeter cannot detect the magnetic flux. For example, the response frequency of the currently most practical high-temperature superconducting DC-SQUID fluxmeter is approximately 1 MHz at most.

Described above are the problems with the conventional technology based on which the present invention has been developed. The problems from the viewpoint of needs are described below.

In the flow of producing a semiconductor device in a wafer process and sending it onto the market, a wafer proving test carried out after forming a bonding pad at the final stage of the wafer process is a method of determining whether or not a chip unit is acceptable in the conventional inspection methods. However, it is difficult to make an appropriate development and production plan by obtaining the yield a this late stage. Therefore, various monitoring processes are performed in the wafer process to predict the yield. The currently most attractive and practical method is a method referred to as a pattern defect inspection method, a method for inspecting a foreign substance and a defect, etc. (hereinafter referred to as a pattern defect inspection method) In this method, the size, form, frequency, distribution, etc. of a defect and a foreign substance can be informed of using the reflection and the scattering of a radiated laser beam, and the emission of a secondary electron and a reflected electron of a radiated laser beam. The obtained information is used in monitoring the state of the wafer process, improving the process, and predicting the yield. However, the pattern defect inspection method has a demerit based on its principle. That is, in this method, observations are not associated with electric characteristics of a transistor, wiring, etc. configuring a device. Namely, only a physically foreign substance and an abnormal shape are observed. Therefore, the determination as to whether or not a finished device chip is acceptable is only indirect determination.

BRIEF SUMMARY OF THE INVENTION

OBJECT OF THE INVENTION

The present invention aims at providing a new inspection method by overcoming the limit in applicable field, performance, etc. of the conventional non-destructive inspection method and apparatus for a semiconductor chip, improving the productivity and reliability of a semiconductor chip.

SUMMARY OF THE INVENTION

The non-destructive inspection method according to the present invention includes: a first step of generating a laser light ranging in wavelength from 300 nm to 1,200 nm, and generating a laser beam converging into a predetermined beam diameter; a second step of predetermined electrical connection means configuring of a predetermined current path for passing an OBIC current generated by an OBIC phenomenon when the laser beam is radiated onto the p-n junction and the vicinity of the p-n junction formed in the semiconductor chip to be inspected at least in the substrate including a wafer state and an installation state during the production process; a third step of scanning a predetermined area of a semiconductor chip while radiating the laser beam; a fourth step of magnetic flux detection means detecting magnetic flux induced by an OBIC current generated by the laser beam at each radiation point scanned in the third step; and a fifth step of determining whether or not there is a resistance increase defect including a disconnection defect or a leak defect including a short circuit defect in a current path.

At this time, a CR delay circuit comprising a capacitance C and a resistor R can also be included in the current path.

Furthermore, the electrical connection means can be designed as a conductive film applied to the entire top surface of the substrate of the semiconductor chip having at least one contact hole in a scattering layer area and having a p-n junction on the substrate.

It is also possible to set the fifth step such that if magnetic flux detected in the fourth step is equal to or larger than a predetermined value at a radiation point where no current path is configured for an OBIC current in a normal state, then it is determined that a leak defect including a short circuit defect has occurred in the current path containing the radiation point, and if magnetic flux detected in the fourth step is smaller than a predetermined value at a radiation point where a current path is configured for an OBIC current in a normal state, then it is determined that a resistance increase defect including a disconnection defect has occurred in the current path containing the radiation point.

As described above, the non-destructive inspection method according to the present invention is based on that an OBIC current generated by radiating a laser beam onto a p-n junction flows through the short circuit portion containing a leak defect as apart of the current path, and that the current induces magnetic flux. Furthermore, to use a SQUID fluxmeter which is a currently available high-sensitivity fluxmeter, it is necessary to have a configuration in which the attenuation time of an OBIC current is equal to or longer than 1 µs, or the current is constant. Therefore, the current path is designed as a closed circuit or a CR delay circuit is inserted into the current path.

The basic configuration includes a laser beam (2 shown in FIGS. 1 and 2), a current path (600 shown in FIG. 1) through which a generated OBIC current flows, and a SQUID fluxmeter (12 shown in FIGS. 1 and 2) which is means for detecting induced magnetic flux. A resistor and a capacitance (670 and 660 shown in FIG. 2) for delaying a CR delay can be contained in the current path.

In an embodiment in a wafer state, means for generating a large amount of magnetic flux by passing a generated OBIC current through the longest possible current path can be configured in a wafer based on the configuration shown in FIGS. 1 and 2 (201 and 202 shown in FIGS. 3 and 4).

Furthermore, in an embodiment in an installation board (circuit substrate), another means for passing a generated OBIC current through the longest possible current path can be provided in a circuit substrate (402 shown in FIG. 6).

Normally, in an embodiment with a structure to be inspected for exclusive evaluation referred to as a test element group (hereinafter referred to simply as a TEG), the detection sensitivity can be improved by configuring another means for passing a generated OBIC current through the longest possible current path in a semiconductor chip to be inspected (603 shown in FIG. 9).

According to the present invention, not only a defect of a p-n junction is directly detected by the OBIC current generated by a p-n junction as a result of the radiation of a laser beam, a leak portion including a short circuit is detected in the current path formed by a short circuit of a portion electrically connected in series with the p-n junction or by a leak path using the flowing OBIC current. At this time, a non-touching observation can be made not by directly detecting an OBIC current, but by detecting the magnetic flux induced by the current. Furthermore, the magnetic flux generated by the OBIC current can also be easily detected by inserting a CR delay circuit containing a parasitic element in the current path.

Additionally, non-touching detection can be performed on a resistance increase defect including a disconnection defect based on the fact that an OBIC current decreases or does not flow due to a resistance increase defect including a disconnection defect in the current path.

For example, FIG. 21 shows an example of a graph indicating the dependence of an OBIC current value for the resistance value in the path through which the OBIC current confirmed by an experiment by the inventor of the present invention flows. To be more practical, the value an OBIC current obtained when a laser beam having a wavelength of 1064 nm is radiated onto a part of the p-n junction in the LSI produced in the normal LSI production process from the surface on which an element of the LSI chip is formed is measured by changing the value of the resistance connected in series with the p-n junction, and by showing a graph of the measurement result with the horizontal axis indicating a resistance value and the vertical axis indicating a current value. The horizontal and vertical axes have a logarithm scale. As shown in FIG. 21, when the resistance value in the current path through which an OBIC current flows increases, the current value of the OBIC current decreases. For example, the value of the OBIC current obtained when the resistance value in the path is 1 MΩ is smaller by 3 digits or more than the value obtained when the resistance value in the path is 100Ω. The value of the magnetic field induced by an electric current is proportional to the current value according to the Biot-Savart's law. Therefore, a resistance increase defect including a disconnection defect in the OBIC current path connected in series with the p-n junction can be easily detected as a change of magnetic flux. In addition, when a current path is generated by a defect occurring where there is normally no OBIC current, and when the current path not only clearly indicates 100 Ω as a short circuit, but also indicates 1 MΩ appropriately referred to as a leak, the current value (0.1 $\mu$A) detectable as magnetic flux although it is very low makes it possible not only to detect a short circuit defect, but also to detect a leak defect.

In the state before forming a bonding pad, a resistance increase defect including a disconnection defect and a leak defect including a short circuit can be detected by detecting the magnetic flux induced by an OBIC current. Furthermore, after forming a bonding pad, the above mentioned defects can be detected without selecting a terminal. Furthermore, in an installation state on a circuit substance, the above mentioned defects can be detected on a semiconductor chip. Means for forming a current path through which an OBIC current flows or a CR delay circuit can be classified as follows based on some cases.

(1) In a process where a conductive film is applied to the entire top surface of the wafer, by using only the conductive film (210 shown in FIG. 20(*a*), and 212 shown in FIG. 20(*b*)), or by setting the same potential for two portions, that is, one end of the conductive film (201 shown in FIGS. 3 and 4) on the top surface of the wafer and the diagonally opposite end on the substrate (202 in FIGS. 3 and 4), a current path (a path indicated by 6 shown in FIGS. 3 and 4, or 261 or 263 shown in FIG. 20) through the substrate can be generated through the top surface of the wafer and the p-n junction in which a leak portion including a short circuit and an OBIC current are generated.

When a pad-formed wafer is used, a similar embodiment can be realized, the entire pad is short-circuited using silver paste or thin gold film or by short-circuiting the pad through a prover. However, in this case, the current path is complicated. Furthermore, a current path cannot be generated in many cases. Therefore, it is not so efficient as the above mentioned method.

When a diced or packaged chip is analyzed, a similar embodiment can be realized by assuming that the above mentioned wafer is a chip. That is, the entire surface of the chip is covered with conductive film such as silver paste, thin gold film, etc. by exposing the top surface of the chip or making a space between the chip and the packaging material. In addition, the chip substrate side can only be exposed at least to the potion where an electrical connection is required and the portion where laser radiation is required. In this method, as compared with the conventional technology, the cost and process steps of an electrical connection can be considerably reduced. Otherwise, all pins can be provided for a short-circuited socket. However, after a pad has been formed, a current path cannot be formed in many cases, which is not an efficient method as in the case where a wafer is used after a pad has been formed. When a packaging process is completed, it is necessary for a chip on the laser radiation side to be exposed. However, it is not necessary that a chip is exposed on the SQUID side.

(2) In a state in which a bare chip is installed on the circuit substrate, two end portions can be selected in several methods depending on the position of a defect on the circuit. For example, a current path, which includes long substrate wiring (402 shown in FIG. 6) on a circuit substrate and passes through a p-n junction and a leak portion including a short circuit in the chip by short-circuiting the power source wiring of a circuit substrate and the substrate potential of a chip in an appropriate position selected on the circuit substrate, can be generated.

(3) When a TEG is formed on a chip with a view to monitoring the state of the process of producing a semiconductor chip or selecting the optimum value of a design parameter or a process parameter, a current path and a CR time constant can be freely set. For example, a path round a scribing line along the circumference of a chip, and a path round inside the scribing line and outside of the bonding pad are current paths which are long and determined, and in which magnetic flux can be easily detected (603 shown in FIG. 9).

In the cases (1) and (2) above, not only the current path is formed by a short circuit and a constant current is detected, but also a transient current can be detected by delaying the transient current based on the response speed of a detector by inserting a resistor and a capacitance into the current path in series as shown in its basic configuration in FIG. 2. In this case, the capacitance and a resistor may not require an additional circuit if a parasitic capacitance, a parasitic resistor, and a floating capacitance can be appropriately used.

It is common with (1) and (2) above, but without any electrical connection to a pad or a substrate, a closed circuit inside a chip or a CR delay circuit can be configured at a certain level, and magnetic flux by an OBIC current can be detected. If a defect can be detected in this method, it is the most efficient method.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 1(a) shows the case in which a leak defect of gate oxidized film is detected, and FIG. 1(b) shows the case in which a resistance increase defect is detected;

FIG. 2(a) shows the case in which a leak defect of gate oxidized film is detected, and FIG. 2(b) shows the case in which a resistance increase defect is detected;

FIG. 3(a) is a sectional view of the entire wafer, FIG. 3(b) is a sectional view showing the details of the case related to a leak defect of gate oxidized film; and FIG. 3(c) is a sectional view showing the details of the case related to a resistance increase defect;

FIG. 7(a) shows an example of a leak defect, and FIG. 7(b) shows an example of a resistance increase defect;

FIG. 9(a) is a top view of the entire system, and FIG. 9(b) is an enlarged view of the portion P shown in FIG. 9(a);

FIG. 10(a) is a top view, and FIG. 10(b) is a sectional view along the line X–X' shown in FIG. 10(a);

FIG. 11(a) is a top view, and FIG. 11(b) is a sectional view along the line Y–Y' shown in FIG. 11(a);

FIGS. 20(a) and 20(b) are typical sectional views at the stages of depositing the first wiring metal film layer and the second wiring metal film layer, respectively, and FIG. 20(c) is a sectional view at the stage of patterning the first wiring metal film layer.

DETAILED DESCRIPTION OF THE INVENTION

The embodiments of the present invention are described below in detail.

Figure 1:
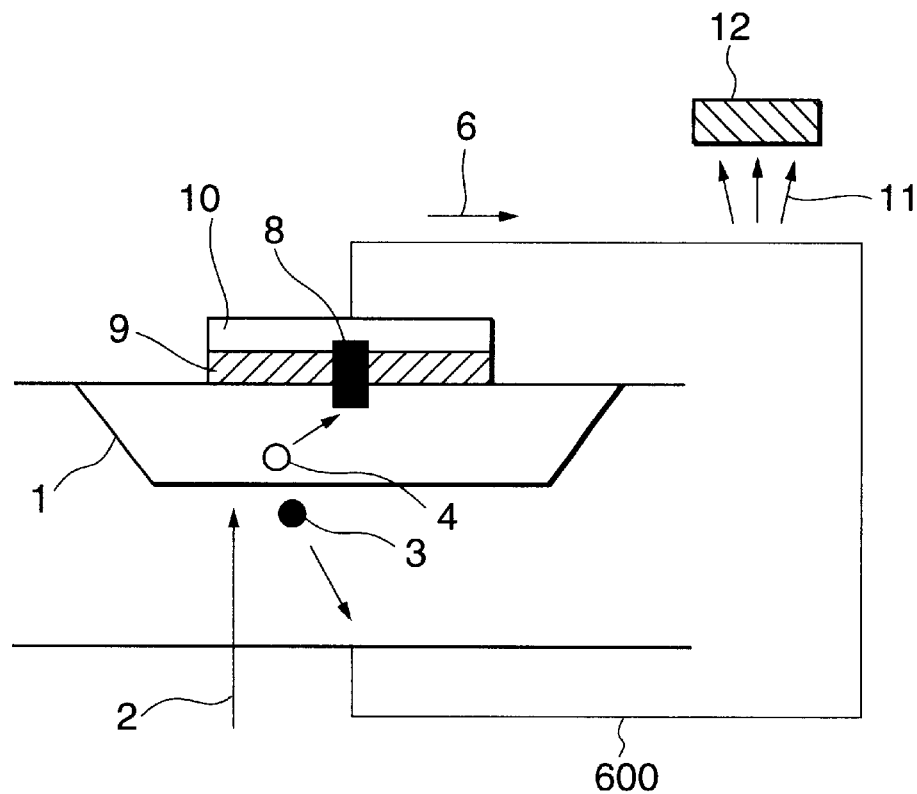
FIGS. 1(*a*) and 1(*b*) show the basic configuration of the non-destructive inspection method according to the present invention.
Figure 1:
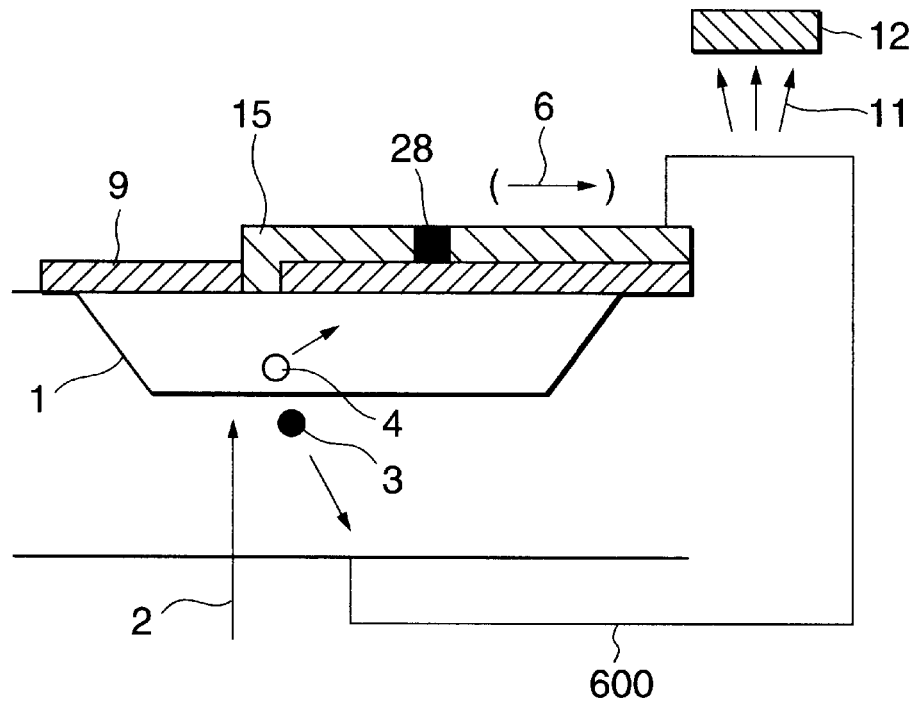
Figure 2:
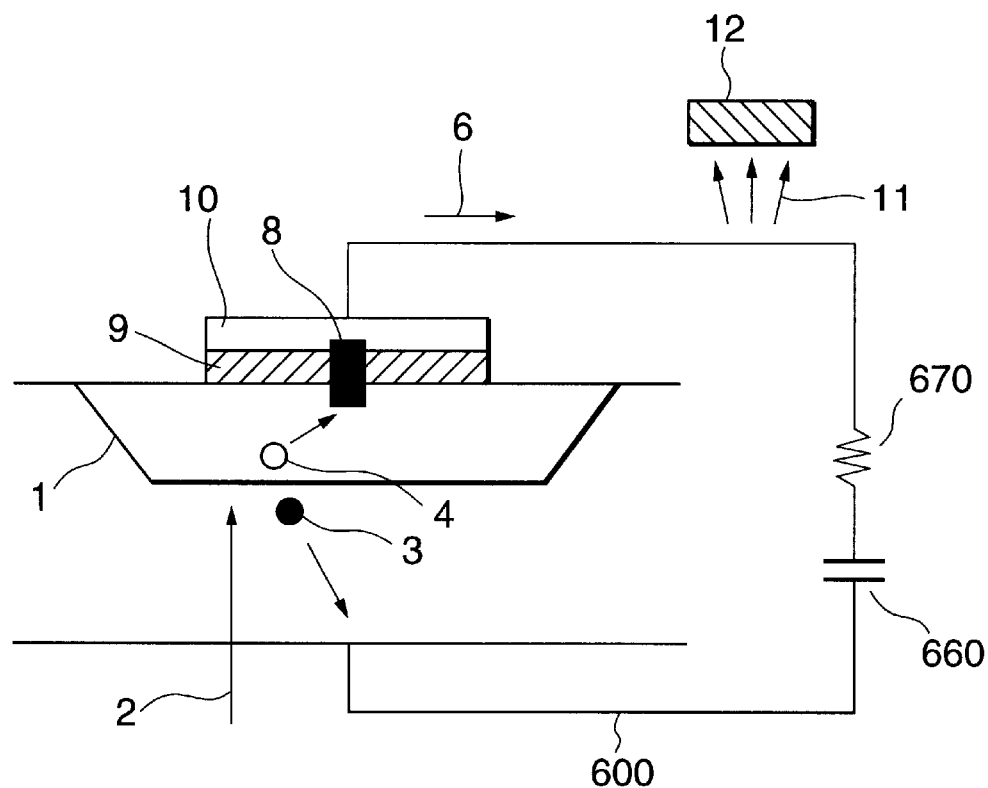
FIGS. 2(a) and 2(b) show the basic configuration of the non-destructive inspection method according to the present invention.
Figure 2:
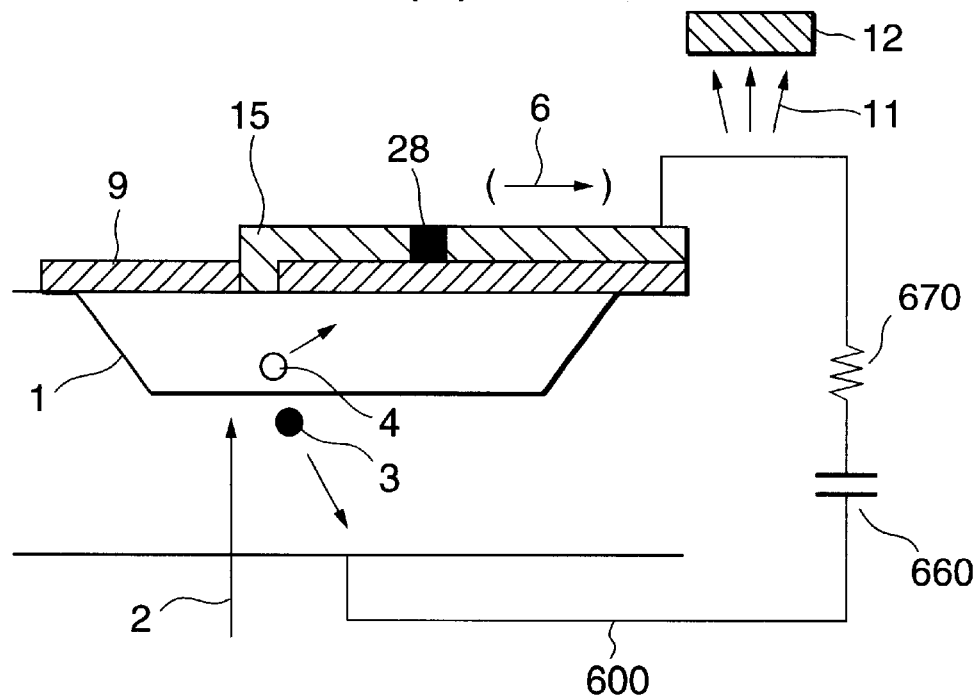

Described first is the basic configuration of the non-destructive inspection method according to the present invention. FIGS. 1 and 2 are typical charts showing the basic configuration in the non-destructive inspection method of the present invention, and respectively show the case in which a current path configuring a path through which an OBIC current flows is configured only by conductive wiring such as copper wires, etc., and the case in which the current path is configured including a CR delay circuit. Furthermore, FIGS. 1(a) and 2(a) refer to a leak defect including a short circuit defect (hereinafter referred to simply as a leak defect), and FIGS. 1(b) and 2(b) refer to a resistance increase defect including a disconnection defect (hereinafter referred to simply as a resistance increase defect).

Described first is the configuration common to all of FIGS. 1(a), 1(b), 2(a), and 2(b). The common units are the laser beam 2, the p-n junction 1 in which an OBIC current is generated when the laser beam 2 is radiated, a conductor 600 (FIGS. 1(a), 1(b)) of copper wires, etc. configuring a current path through which the OBIC current 6 flows, or a capacitance 660 and a resistor 670 configuring a CR delay circuit (FIGS. 2(a) and 2(b)). Furthermore, the configuration also includes the magnetic flux 11 generated when the OBIC current 6 flows, and the SQUID fluxmeter 12 for detecting the flow as main components. In FIGS. 1(a) and 2(a), a defect 8 exists in insulation film 9, thereby causing a short circuit or a leak by an electrode 10 on the insulation film and one scattering layer forming the p-n junction 1. In FIGS. 1(b) and 2(b), a resistance increase defect 28 exists in an internal wiring 15.

The non-destructive inspection method according to present invention comprises at least: a first step of generating a laser light ranging in wavelength from 300 nm to 1,200 nm, and generating a laser beam converging into a predetermined beam diameter; a second step of a predetermined electrical connection means configuring a current path for passing an OBIC current generated by an OBIC phenomenon when the laser beam is radiated onto the p-n junction and the vicinity of the p-n junction formed on the substrate of a semiconductor chip to be inspected including a wafer state and an installation state; a third step of scanning a predetermined area of a semiconductor chip while radiating the laser beam; a fourth step of magnetic flux detection means detecting magnetic flux induced by an OBIC current generated by the laser beam at each radiation point scanned in the third step; and a fifth step of determining whether or not there is a resistance increase defect or a leak defect in a current path.

Figure 13:
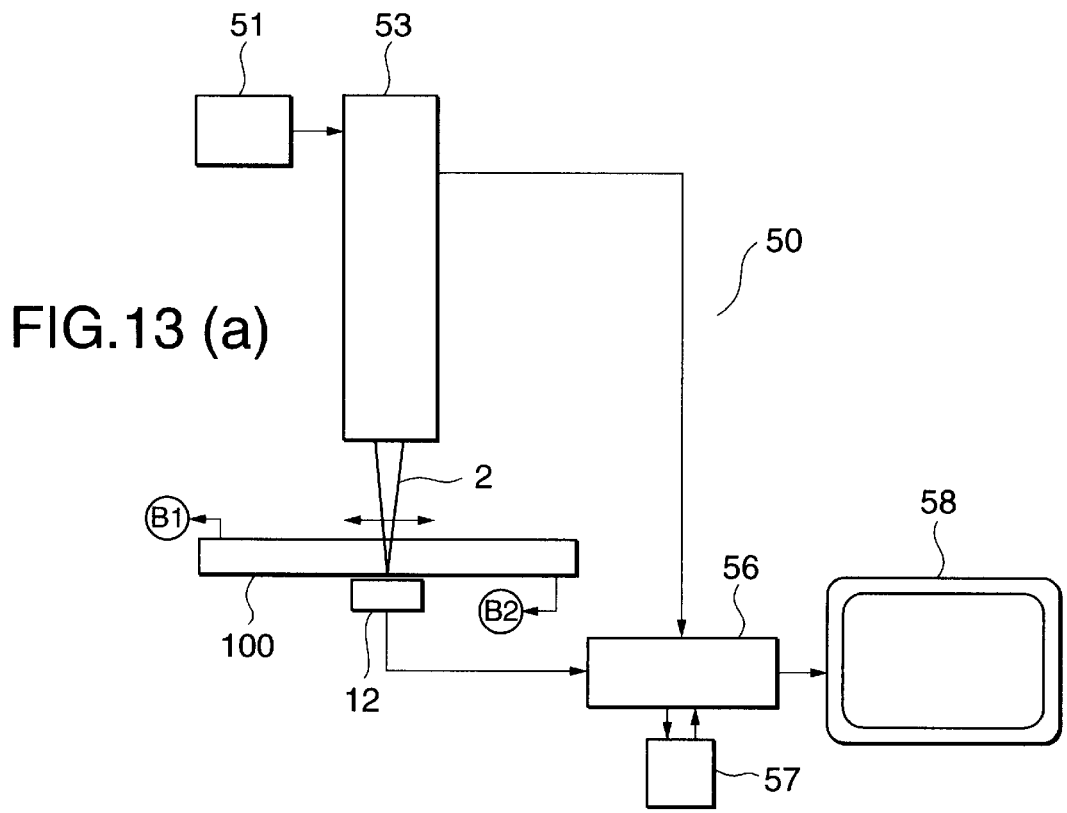
FIGS. 13(a) through 13(c) are block diagrams showing the configurations of examples of the non-destructive inspection method according to the present invention.
Figure 13:
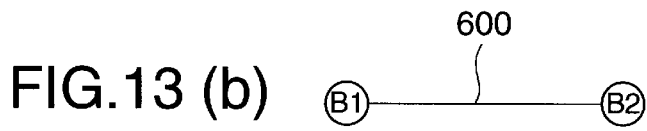
Figure 13:
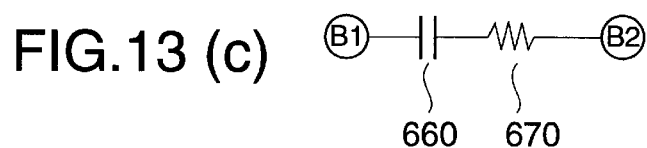
Figure 14:
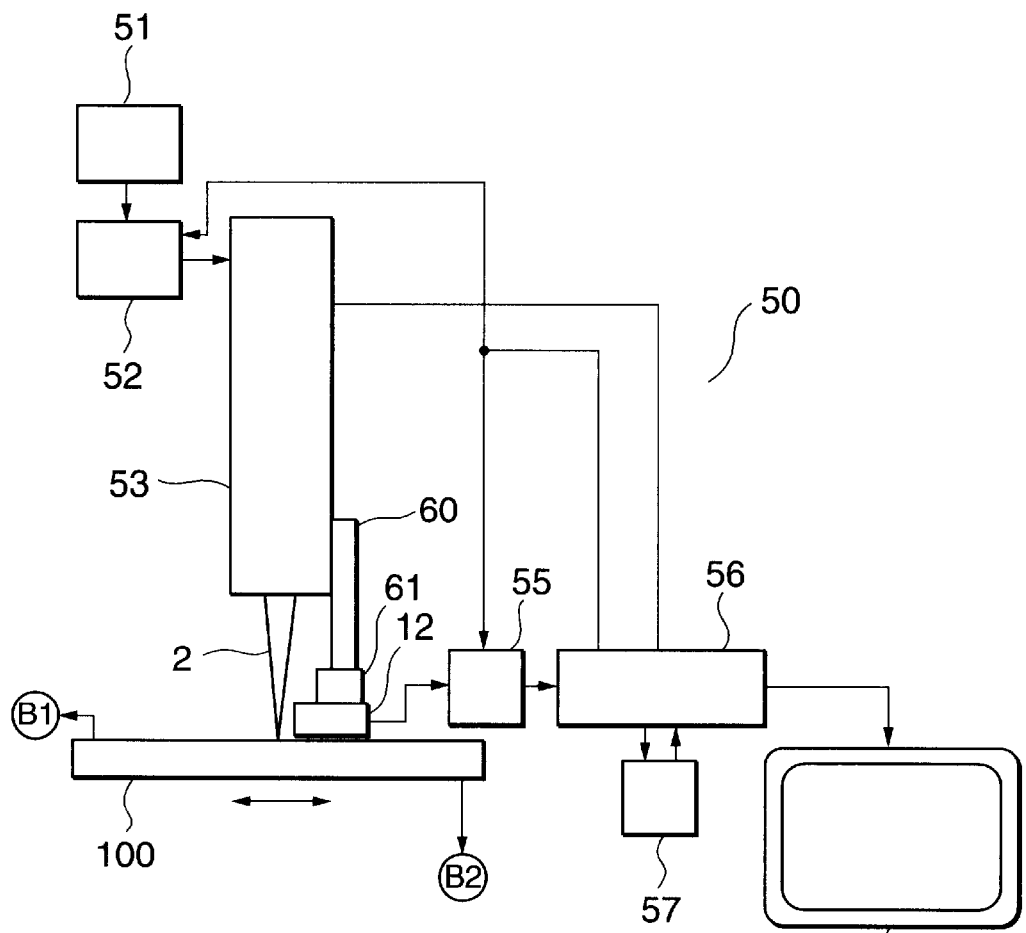
FIG. 14 is a block diagram showing the configuration of an embodiment of the non-destructive inspection method of the present invention.
Figure 15:
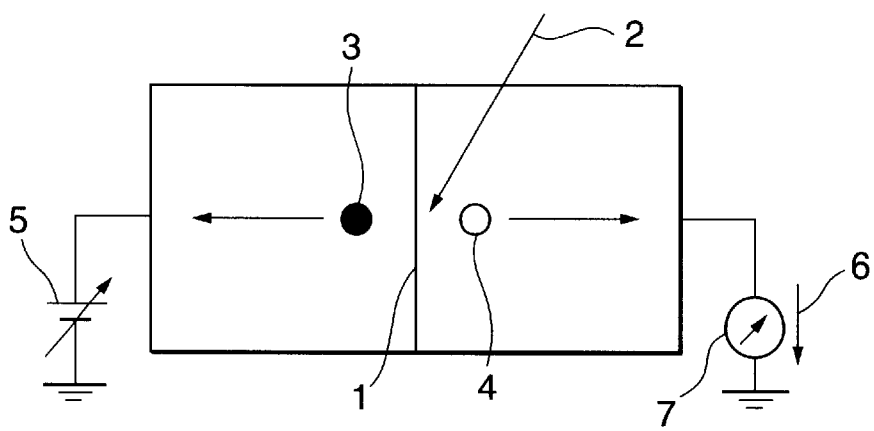
FIG. 15 shows the first conventional technology.
Figure 16:
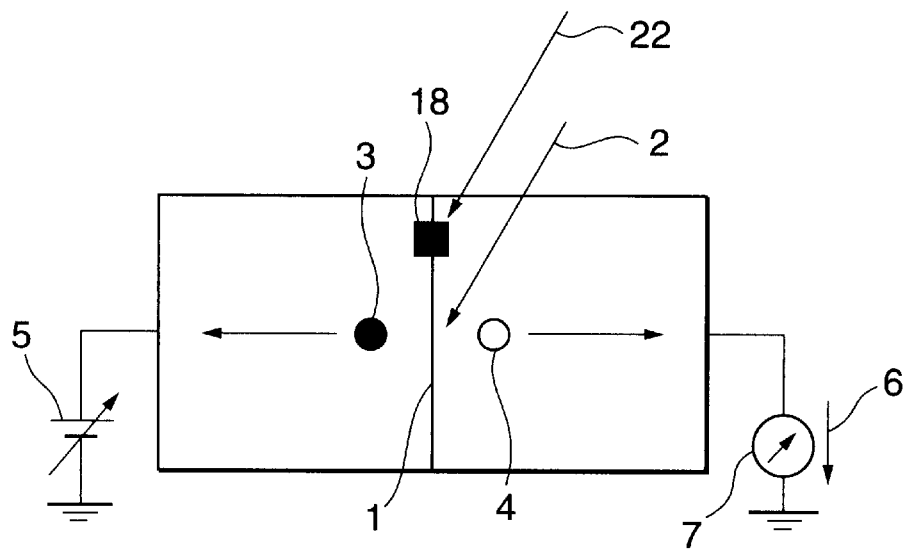
FIG. 16 shows the principle of detecting a defect on a p-n junction according to the first conventional technology.
Figure 17:
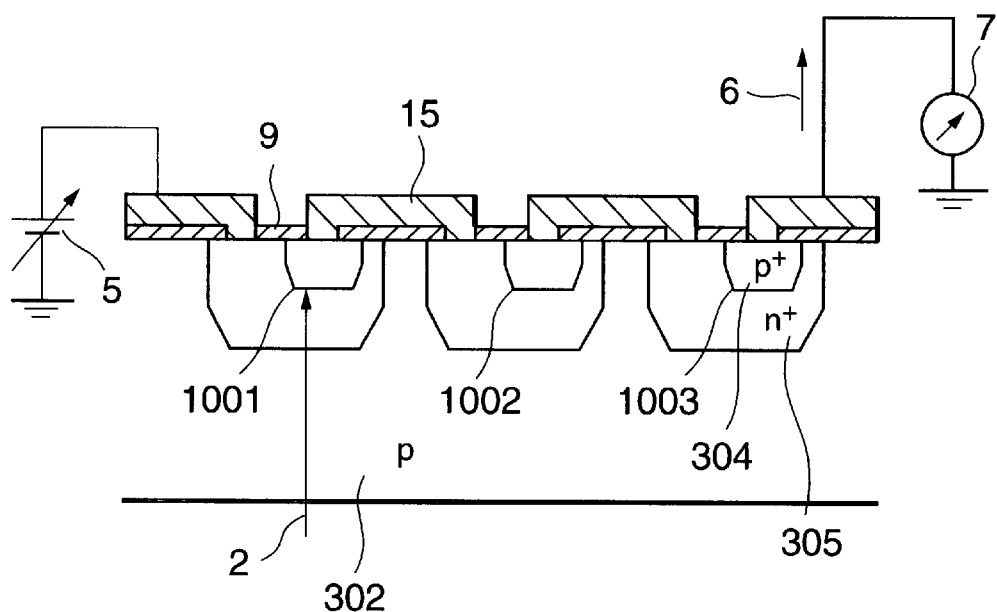
FIG. 17 shows the principle of detecting a disconnection in the wiring according to the first conventional technology.
Figure 18:
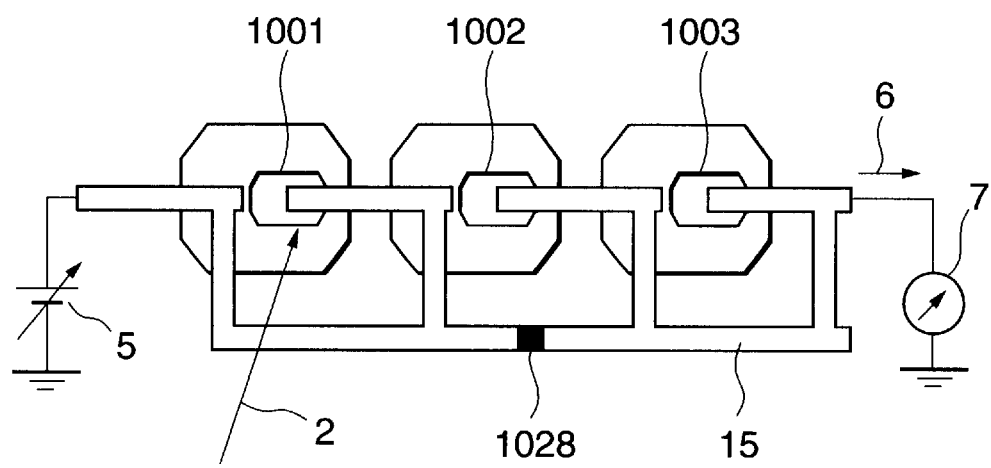
FIG. 18 shows the principle of detecting a disconnection in the wiring according to the first conventional technology.
Figure 19:
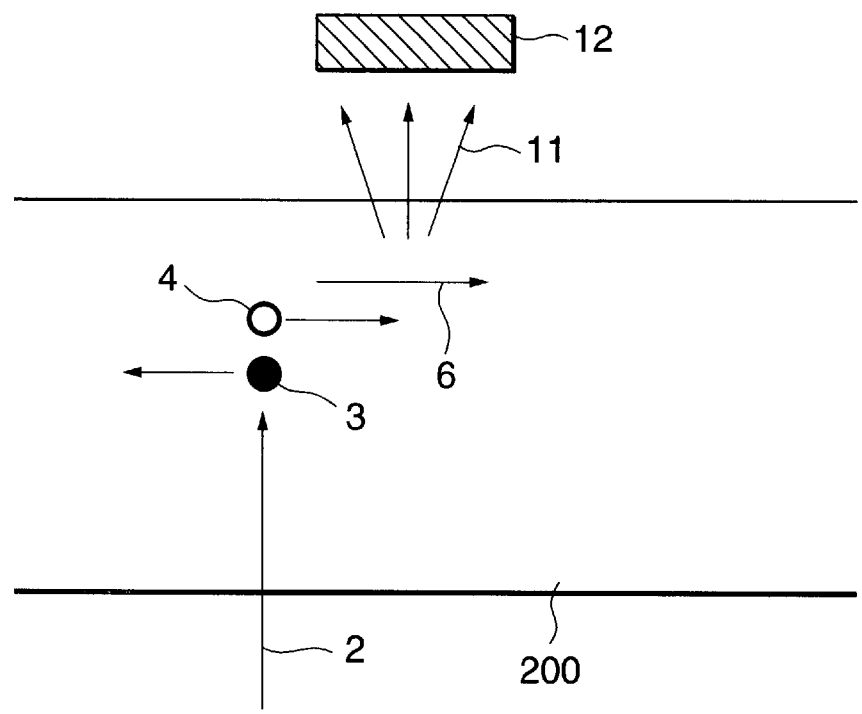
FIG. 19 shows the second conventional technology.

As shown in, for example, a block diagram of the rough configuration in FIG. 13, a non-destructive inspection device 50 applicable in carrying out the above mentioned inspection comprises: a laser light source 51 for generating a laser light whose wavelength is in the range of 300 nm to 1200 nm; an optical system 53 which is laser beam generation means for generating the laser beam 2 converging at a predetermined beam diameter; the SQUID fluxmeter 12 which is magnetic flux detection means for detecting a magnetic flux induced by the OBIC current generated by an OBIC phenomenon when the laser beam 2 is radiated on the p-n junction formed in the substrate of a chip including the wafer state and the installation state, and its vicinity to be inspected; a control device 56 for controlling the entire device, a storage device 57; a display device 58; and laser beam scanning device (not shown in the attached drawings) for scanning a predetermined area of a chip to be inspected including the wafer state and the installation state while radiating the laser beam. The laser beam scanning means can mount and move a wafer with a chip or a plurality of chips, which are to be inspected, arranged in order on the X-Y stage, or can move the optical system 53, and can deviate the laser beam 2 by providing a mirror, etc. in the optical system 53, thereby selection appropriate means depending on the purpose. A SQUID fluxmeter can be scanned as necessary. Furthermore, as shown in FIG. 14, for example, it further comprises a modulation device 52 for modulating the intensity of a laser beam according to a modulation signal from the control device 56; and a lock-in amplifier 55 for synchronously amplifying a signal from the SQUID fluxmeter 12. Additionally, a first fixing means 60 for fixing the relative position between the radiation point for which the laser beam 2 is most limited and the SQUID fluxmeter 12 for detecting magnetic flux, or second fixing means (not shown in the attached drawings) fixing the position of the SQUID fluxmeter 12 in the optimum detection position on the circuit substrate on which the chip to be inspected is mounted is omitted in the attached drawings. However, each of them is provided with a fine adjustment unit 61 for an arm fixed to the housing for support of the optical system 53 or the specimen table for holding the circuit substrate, and the SQUID fluxmeter 12 is mounted through the fine adjustment unit 61. Using the fine adjustment unit 61, the SQUID can be scanned.

The first embodiment of the present invention is described below in detail by referring to the attached drawings.

Figure 3:
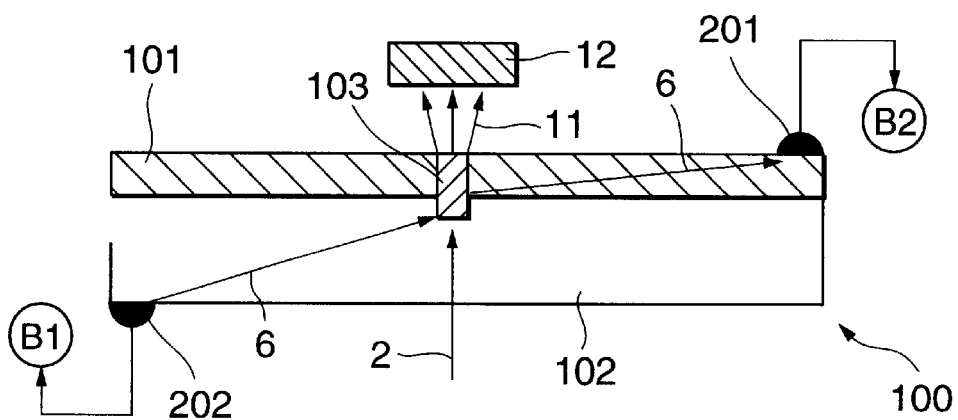
FIGS. 3(a) through 3(c) show the first embodiment of the present invention.
Figure 3:
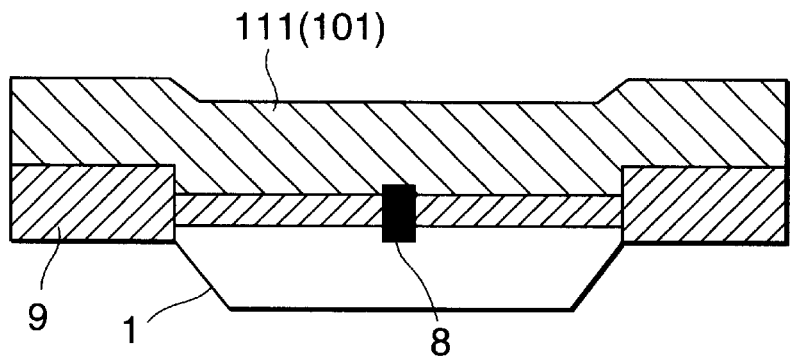
Figure 3:
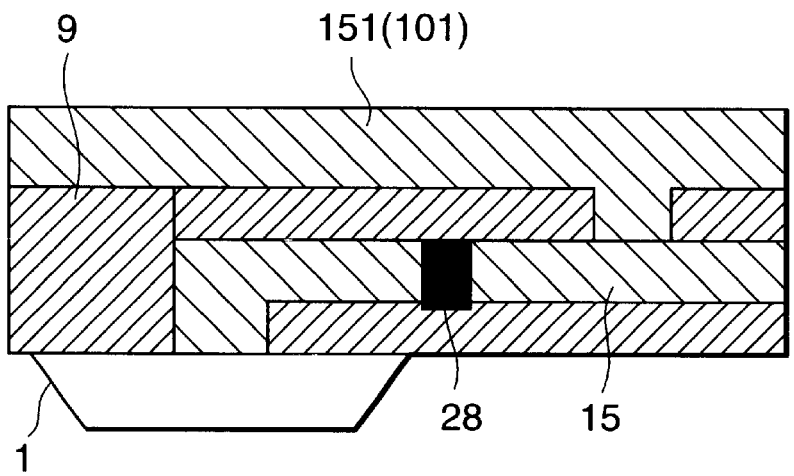
Figure 4:
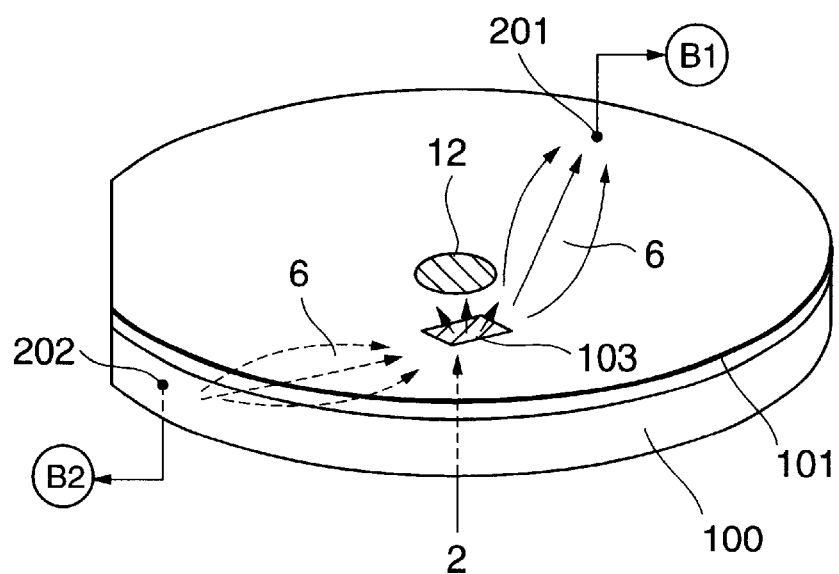
FIG. 4 is a typical perspective view showing the first embodiment of the present invention.

In the first embodiment, a resistance increase defect including a disconnection or a leak portion including a short circuit is detected resistance increase defect is detected in the production process in which a plurality of chips are arranged in order in a wafer state. Especially, an inspection carried out in the production process with conductive thin film for an electrode is entirely formed on the top layer is shown. FIG. 3 is a typical sectional view of the configuration of the central unit including a defective portion. FIG. 4 is a typical perspective view of the main configuration. FIG. 3(*a*) is a typical sectional view of the entire wafer to be inspected. FIGS. 3(*b*) and 3(*c*) are typical sectional views of portions including defects and the p-n junctions showing a case of a leak defect and a resistance increase defect, respectively.

First, the description is given below by referring to FIG. 3(*a*), and also FIGS. 3(*b*) and 3(*c*) as necessary. At the stage of carrying out an inspection or making an observation, a conductive thin film 101 for an electrode, etc. is entirely applied during the process of configuring the internal wiring in a wafer 100. FIG. 3(*a*) shows the moment of radiating the strictly limited laser beam 2 from behind the wafer 100, setting a focal point on the right surface, and radiating the beam onto the p-n junction (1 shown in FIGS. 3(*b*) and 3(*c*)) in series with a defect in a portion 103 containing a defect and a p-n junction during the scanning process. FIG. 3 also shows the path of the OBIC current 6 generated at this time. B1 is connected to B2 through a conductor (600 shown in FIGS. 1 and 13) of copper wires, etc. not shown in FIG. 3. In FIG. 3, the laser beam 2 is radiated from behind the wafer 100, but it can be radiated from the right surface as necessary.

Since a laser light in the range of 1064 to 1152 in wavelength indicates low attenuation in silicon (Si), a laser beam can be radiated onto the right surface of a chip from behind the wafer. Since the SQUID fluxmeter 12 can be arranged on the right side of the wafer, the fluxmeter is close to the OBIC current 6, thereby obtaining the merit that large magnetic flux can be detected.

If a laser beam can be more easily radiated from the right side, an Ar laser having a wavelength of 488 nm, an He—Ne laser having a wavelength of 633 nm, etc. can be used. The shorter the wavelength is, the higher the spatial resolution of an obtained image becomes.

When a laser having a wavelength equal to or longer than 1200 nm is used, an OBIC is hardly generated. For example, although the OBIC is hardly generated with a wavelength of 1300 nm, it is known that there arises the defect that a thermoelectromotive force current is generated when a laser is radiated onto a defective portion. The thermoelectromotive force current value is normally 1 nA or smaller, and the OBIC current is 1 $\mu$A, and possibly 100 $\mu$A, that is, larger by 3 to 5 digits. According to the present invention, the wavelength area of a laser is limited to 1200 nm or lower with a view to actively using an OBIC current for the above mentioned reason.

To increase the magnetic flux generated by an OBIC current, a longer current path is more effective. To obtain the longest current path, the conductive thin film 101 at an optional end portion of the wafer 100 to which the conductive thin film 101 covering the entire top layer is defined as a current retrieval unit 201 which is the first end portion, and the lower surface of a wafer substrate unit 102 is provided as a current retrieval unit 202 which is the second end portion in the position symmetrical to the current retrieval unit 201 about the central point of the wafer 100 such that they can be the farthest from each other on the wafer. This is clearly indicated also by referring to FIG. 4. In FIG. 4, the current paths are concentrated around the current retrieval units 201 and 202 and an OBIC current generation unit (portion 103 containing a defect and a p-n junction), and are also dispersed among them. A short circuit between the current retrieval units 201 and 202, that is, between B1 and B2, by the conductor 600 such as copper wires, etc. forms a current path of an OBIC current. As a result, a current path of an OBIC current is configured, a constant current flows, the constant current generates constant magnetic flux, and the magnetic flux can be detected.

Furthermore, as shown in FIG. 13(*c*), by configuring a current path between B1 and B2 by inserting the capacitance 660 and the resistor 670 in series, the attenuation of the transient current can be delayed. Therefore, a magnetic flux detector which is slow in issuing a reply can detect magnetic flux by a transient current. The capacitance 660 and the resistor 670 can use a parasitic capacitance, a floating capacitance, or a parasitic resistor. When a short circuit occurs between the current retrieval units 201 and 202 by the conductor 600, it is necessary to set the current path such that the magnetic flux generated by the OBIC current 6 in the wafer substrate and of the electrode material cannot be reduced. To attain this, a current path configured by the conductor 600 such as copper wires, etc. connected to the current retrieval units 201 and 202 is extended sufficiently further from the wafer 100, and is short-circuited in a position sufficiently farther from the wafer 100. That is, there is no technical difficulty.

The paths through which OBIC currents flow in the wafer substrate unit and the electrode material film concentrate in a narrow range at the current retrieval units 201 and 202, and the generation source (portion 103 containing a defect and a p-n junction) of OBIC currents as shown in FIG. 4.

However, they spread in the process. Since it is more effective to detect magnetic flux in a narrow position of the current path, it is efficient to provide the SQUID fluxmeter 12 close to an OBIC current generation source (the position of the SQUID fluxmeter 12 is set apart in FIG. 4 for easier visibility).

Since the OBIC current generation source is always positioned at the focal point of laser beams from which the laser beams radiate, it is efficient to scan a wafer with the relative position of the focal point of the laser beam 2 and the SQUID fluxmeter 12 fixed.

Figure 5:
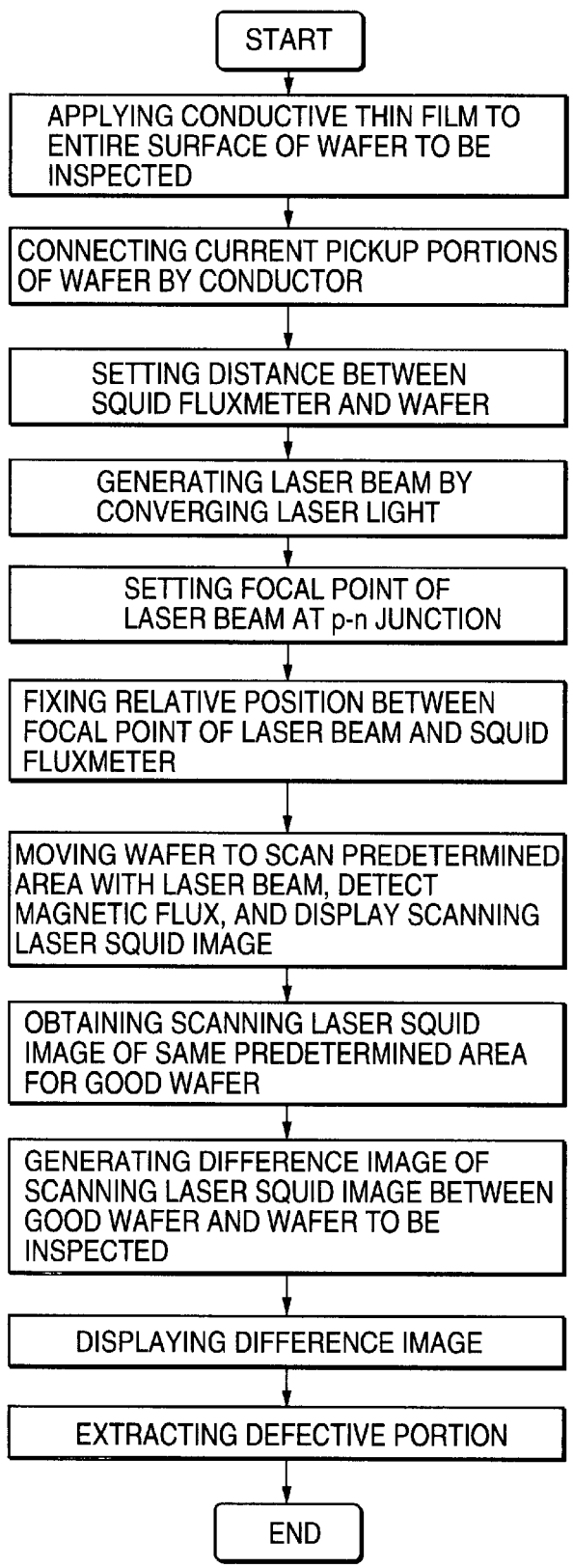
FIG. 5 is a flowchart of the operations according to the first embodiment of the present invention.

Next, the operations according to the first embodiment are described below by referring to the flowchart shown in FIG. 5, and also to FIGS. 3, 4, 13, and 14 appropriately. In the description, the details of the above mentioned items are appropriately omitted for comprehensibility of the flow.

First, with the conductive thin film 101 applied on the entire surface of the wafer 100, the wafer 100 is short-circuited by the conductor 600 between the current retrieval units 201 and 202, that is between B1 and B2. Then, the distance between the wafer 100 and the SQUID fluxmeter 12 is determined. Generally, it is advantageous that they are located as close as possible since the detected magnetic flux becomes large. When there is a vacuum between the wafer 100 and the SQUID fluxmeter 12, they can be close to each other so far as they do not touch each other. That is, there can be a space of about 1 mm between them.

Then, the laser beam 2, which is obtained by converging laser light generated by the predetermined laser light source 51 into a beam diameter, is radiated, and the focal point of the laser beam 2 is set in the position of the p-n junction on the wafer.

The SQUID fluxmeter 12 is moved on a plane parallel to the plane of the wafer 100 to set the relative position between the focal point of the laser beam and the center of the SQUID fluxmeter 12 in the position where the highest intensity of the detected magnetic flux intensity is predicted, and it is fixed by the first fixing means 60. The position where the highest intensity of the detected magnetic flux intensity is predicted is normally the position in which the distance between the plane vertical to the magnetic flux detection plane including the current path and the center of the SQUID fluxmeter 12 is the distance between the wafer 100 and the SQUID fluxmeter 12, that is, about the distance of h. In the present embodiment, the position of the focal point of the laser beam where the width of the current path is narrow and the position of the SQUID fluxmeter 12 are shown in an perspective view (FIG. 4), and the distance from the straight line connecting the current retrieval units 201 and 202 is set to be approximately h.

Then, the wafer is moved, and the scanning process is started on the wafer using the laser beam 2. The magnetic flux is detected for each radiation point, the intensity information or the color information is generated depending on the detected magnetic flux, the generated information is stored with the coordinate information about each radiation point including the magnetic flux in the storage device 57, and displayed on the display device 58 according to the generated intensity information or color information. The processes are sequentially repeated. When the signal-to-noise ratio (S/N) of the detected magnetic flux is not sufficiently high, the modulation device 52 modulates the intensity of the laser beam 2 according to the modulation signal from the control device 56, and the lock-in amplifier 55 amplifies the signal in synchronization with the modulation signal, thereby considerably improving the S/N ratio.

The display position of the detected magnetic flux is the radiation position of the laser beam on the wafer, and therefore corresponds to an OBIC current generation position. The obtained image (hereinafter referred to as a scanning laser SQUID image) indicates an OBIC current generation position. Furthermore, a practical OBIC current generation position on the wafer can be easily found by detecting a reflected light of a laser beam by a photodiode and displaying it as an image, that is, corresponding to a laser light scanned image.

Whether an OBIC current generation position relates to a correct portion or a defective portion depends on the observing process. When an observation is made in the process where electrode material film 111 is applied to the entire insulation film as shown in FIG. 3(b), a leak defect is detected right above the OBIC current generation position. If an observation is made in the process where a wiring thin film 151 forming the internal wiring is entirely applied as shown in FIG. 3(c), then the resistance increase defect 28 has occurred in the internal wiring 15 connected in series with the p-n junction 1 when no OBIC current has been generated or the current value has considerably been reduced in a place where a OBIC current is to be generated. In this case, to recognize the position of a resistance increase defect including a disconnection, comparison is carried out with a scanning laser SQUID image of a good product obtained in advance. For easier comparison, a difference image is generated by difference image generation means (not shown in the attached drawings) as shown in the final portion of the flow shown in FIG. 5. When samples of good products shown in the images of good products are largely different, a standard value is predetermined based on the intensity distribution for each pixel using images of a number of good samples, and it is determined whether or not a product is defective based on the standard value. In this case, it is determines there is a leak defect when an OBIC current equal to or higher than the predetermined standard value flows at a point of a normal product where the OBIC current does not flow. On the other hand, it is determined that there is a resistance increase defect including a disconnection defect when the standard value is not reached at a point where the OBIC current flows through a normal product. By obtaining a difference image by computing the difference for each pixel, an image relating only to a defect can be obtained. When an observation is made in a process of combining FIGS. 3(b) and 3(c), it is necessary to generate a difference image from a scanning laser SQUID image of a good product. The difference image generation means can be easily realized by, for example, providing a microcomputer (hereinafter referred to as an MPU) in the control device 56 for process by the MPU using software.

For visibility of the position of an OBIC current is generated which is not to be generated in a good product, or the position in which an OBIC current to be generated is not generated or reduced (hereinafter collectively referred to as an OBIC abnormal position), a scanning laser SQUID image according to the present invention or its difference image can be overlapped and displayed with a laser scanned image. By recognizing the OBIC current abnormal position in a chip unit, a defective chip can be detected, and a yield can be predicted in advance. By recognizing the detailed position inside the chip, a defect or fault can be analyzed, and the information about the producing process and the design improvement can be obtained.

Furthermore, by changing the temperatures when an observation is made on the same chip, a good product can be in a defective state. In this case, the above mentioned 'good 'product' and 'defective product' can be respectively read as 'good state' and 'defective state' to make the above explanation effective.

It has been very difficult in the conventional technology to recognize a defective chip before forming a bonding pad. Therefore, using the present method, a yield can be precisely predicted, which has been almost impossible in the conventional method. By precisely predicting a yield, a cost and a delivery date can be correctly predicted.

When it is necessary to recognize the detailed position inside a chip to analyze and monitor a defect, it may also be necessary to observe a leak current path. In such a case, a SQUID can be scanned with the relative position between a laser and a chip fixed. In this case, it is difficult to obtain the high resolution of a scanning laser SQUID image, but a current path can be specified to some extent.

The spatial resolution of the scanning laser SQUID image and the laser scanned image according to the present invention approximately corresponds to the beam diameter of a laser beam. It is not technologically difficult to raise the beam diameter of a laser beam up to the upper diffraction limit depending on the wavelength of a laser light and the numerical aperture of an objective used. For example, when an Ar laser having a wavelength of 488 nm is used, and the numerical aperture of an objective is 0.80, the diffraction limit is about 370 nm. The OBIC abnormal position can be specified with the precision.

Figure 20A:
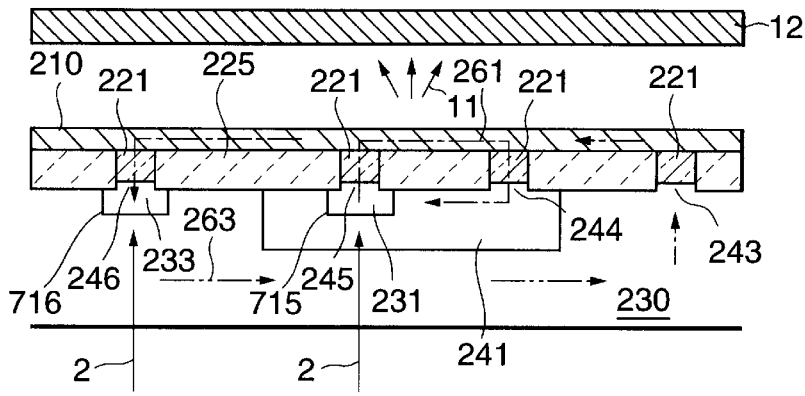
FIGS. 20(a) through 20(c) show the section around the p-n junction in the process of producing a semiconductor chip.
Figure 20B:
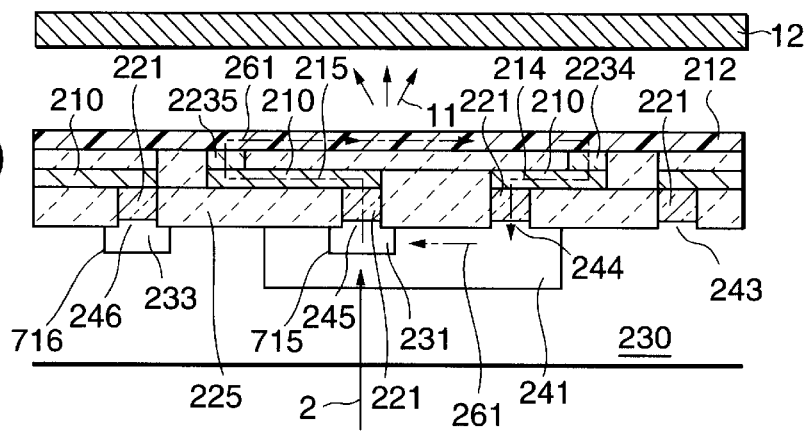

As a method of configuring a current path in the second step in the explanation above, current pickup units B1 and B2 are connected to each other through the conductor 600 such as copper wires, etc. outside the wafer 100. However, it is not always necessary to carry out the connection outside the wafer 100. For example, the second step can be set as a process of depositing metal wiring film of each wiring layer for forming inner connection wiring when a wafer is being produced to produce a semiconductor chip. FIG. 20 shows a typical sectional view of the vicinity of the p-n junction 1 in the producing process of the semiconductor chip. FIGS. 20(a) and 20(b) are sectional views at the stage of depositing the wiring metal film of the first metal wiring film, and at the stage of depositing the wiring metal film of the second layer. As the wiring metal film of the first layer and the wiring metal film of the second layer, for example, aluminum (Al) film having a predetermined thickness can be deposited. As a contact portion metal film 221, predetermined barrier metal film such as titanic silicide (TiSi), cobalt cilicide (CoSi), etc., plug metal such as tungsten (W), etc. can be used. They can be formed as necessary, and the materials are not limited to these applications. In FIG. 20, Al wiring film 210 of the first layer and Al wiring film 212 of the second layer constitute connection means for forming a current path of an OBIC current at the time when they are deposited. For example, when the connection means is the Al wiring film 210 of the first layer, a current path of an OBIC current is formed for almost all p-n junctions, but the path is somewhat short. Practically, when the laser beam 2 is radiated onto a p-n junction 716 formed by, for example, an n-type diffused area 233 and a p-type substrate 230, a current path passing through a substrate contact portion 243, the Al wiring film 210 of the first layer, and an n-type diffused area contact portion 246 is formed, and an OBIC current 263 is generated. Furthermore, when the laser beam 2 is radiated onto a p-n junction 715 formed by an n-type diffused area 241 and a p-type diffused area 231, a current path passing through the Al wiring film 210 of the first layer, and an n-type diffused area contact portion 244 is formed through a p-type diffused area contact portion 245, and an OBIC current 261 is generated.

Furthermore, when the connection means is the Al wiring film 212 of the second layer, the p-n junction capable of forming a current path of an OBIC current is limited. However, since the path passes not only the contact hole but also the wiring of the first layer, the connection hole between the first and second layer, and the wiring metal film of the second layer, the entire path is rather long. Therefore, it is preferable in detection sensitivity, and the defects can be more easily detected. Practically, for example, the p-n junction 716 formed by the n-type diffused area 233 and the p-type substrate 230 cannot form a current path although the laser beam 2 is radiated. Therefore, no OBIC current flows. However, when the laser beam 2 is radiated onto the p-n junction 715 formed by the n-type diffused area 241 and the p-type diffused area 231, a current path is formed by an Al wiring 215 of the first layer, a connection hole filling metal 2235 between the first and second layers, the Al wiring film 212 of the second layer, a connection hole filling metal 2234 between the first and second layers, an Al wiring 214 of the first layer, and the n-type diffused area contact portion 244 through the p-type diffused area contact portion 245, and the OBIC current 261 is generated. Similarly, although not shown in the attached drawings, when a larger number of wiring layers are provided, a current path of an OBIC current can be formed using the metal film as connection means although an observable p-n junction is more strictly limited at the stage of depositing metal film forming each wiring layer. Therefore, in any case, an OBIC current flows by the radiation of a laser beam without connection through a conductor of copper wires, etc. outside the wafer, thereby generating the magnetic flux 11 which can be detected by the SQUID fluxmeter 12, and detecting the existence of a resistance increase defect or a leak defect in a path.

Figure 20C:
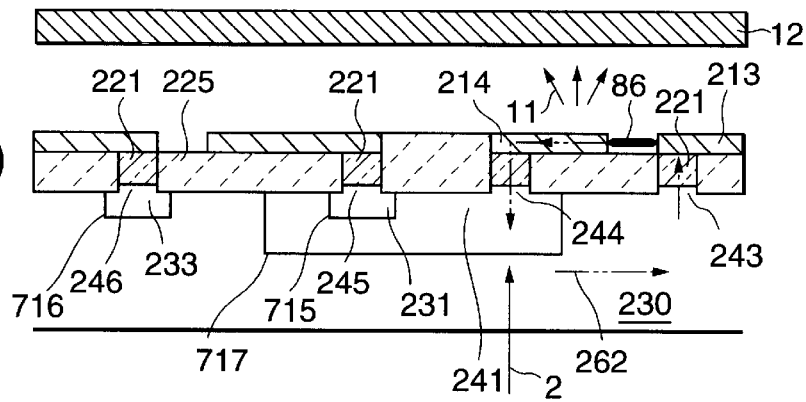
Figure 21:
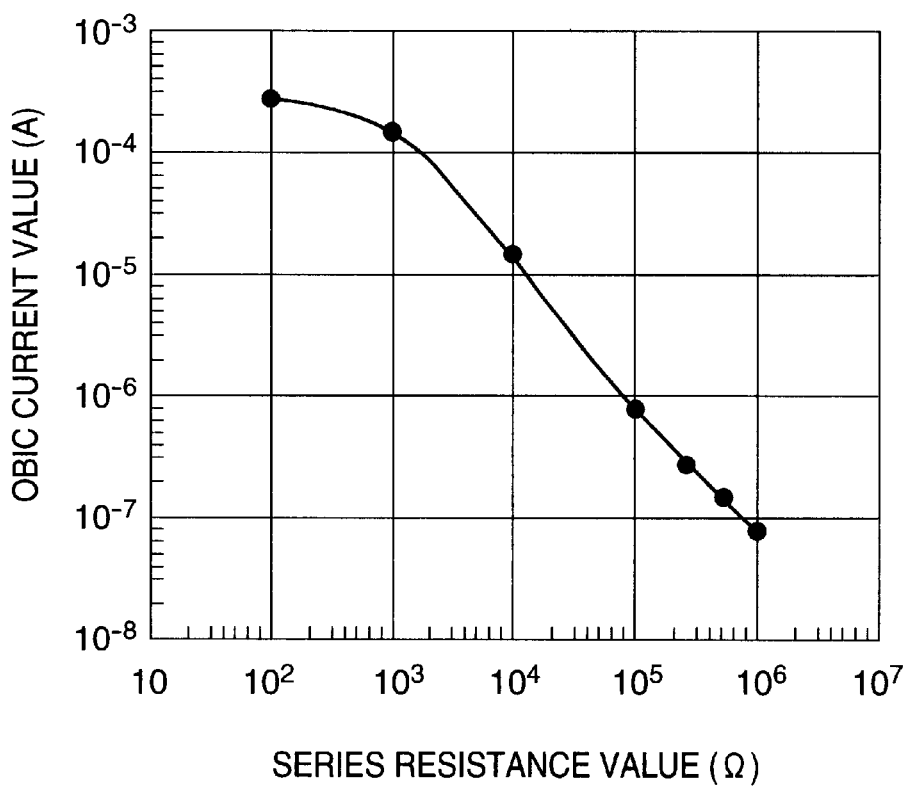
FIG. 21 shows an example of a graph showing the dependence of a value of an OBIC current for a resistance value in the path in which the OBIC current flows.

When a leak defect can be detected, for example, the process before the processes shown in FIG. 20(b), that is, the stage before depositing the Al wiring film 212 of the second layer is easy to consider. FIG. 20(c) is a sectional view of the portion shown in FIG. 20(b) at that stage. In the range shown in FIG. 20(c), no structure generates an OBIC current with the radiation of a laser beam when there is no defect. If bridging occurs due to a leak defect 86 between the Al wiring 214 of the first layer connected to the n-type diffused area contact portion 244 and the Al wiring 213 of the first layer connected to the substrate contact portion 243, then a closed circuit, through which an OBIC current through the substrate contact portion 243, an Al wiring 213 of the first layer, the leak defect 86, the Al wiring 214 of the first layer, and the n-type diffused area contact portion 244 flows, is formed by the radiation of a laser beam onto a p-n junction 717

The second embodiment of the present invention is described below in detail by referring to the attached drawings.

Figure 6:
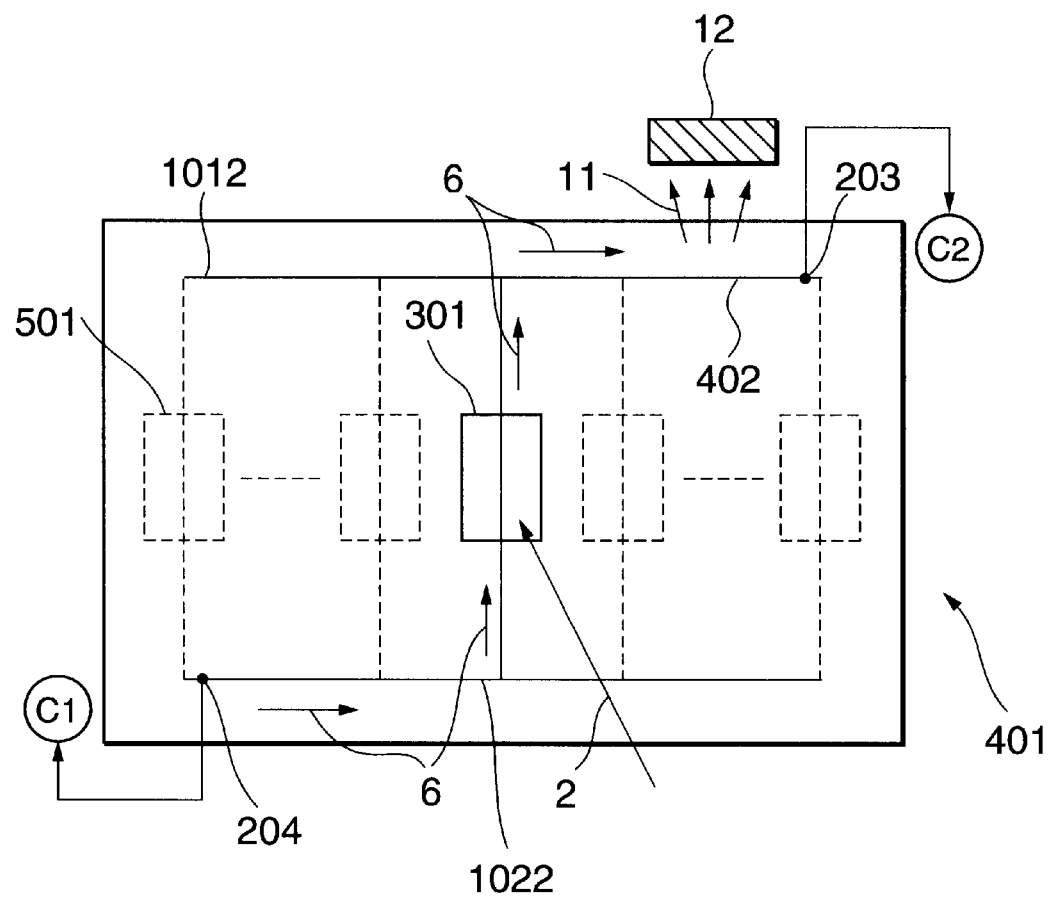
FIG. 6 shows the second embodiment of the present invention.
Figure 7:
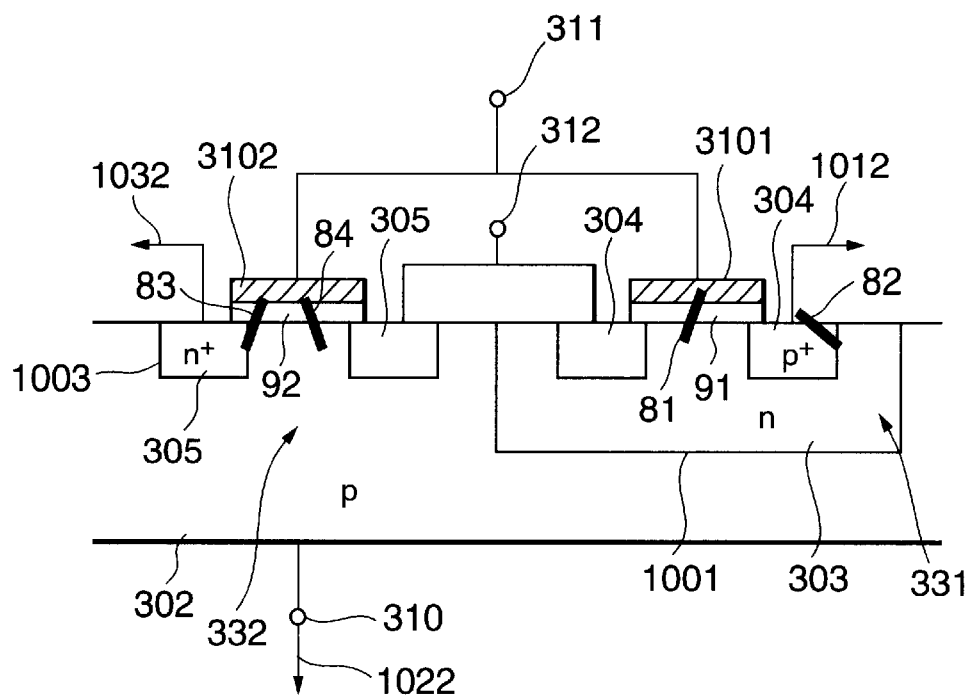
FIGS. 7(a) and 7(b) show an example of a portion containing a defect of a chip to be analyzed according to the second embodiment of the present invention.
Figure 7:
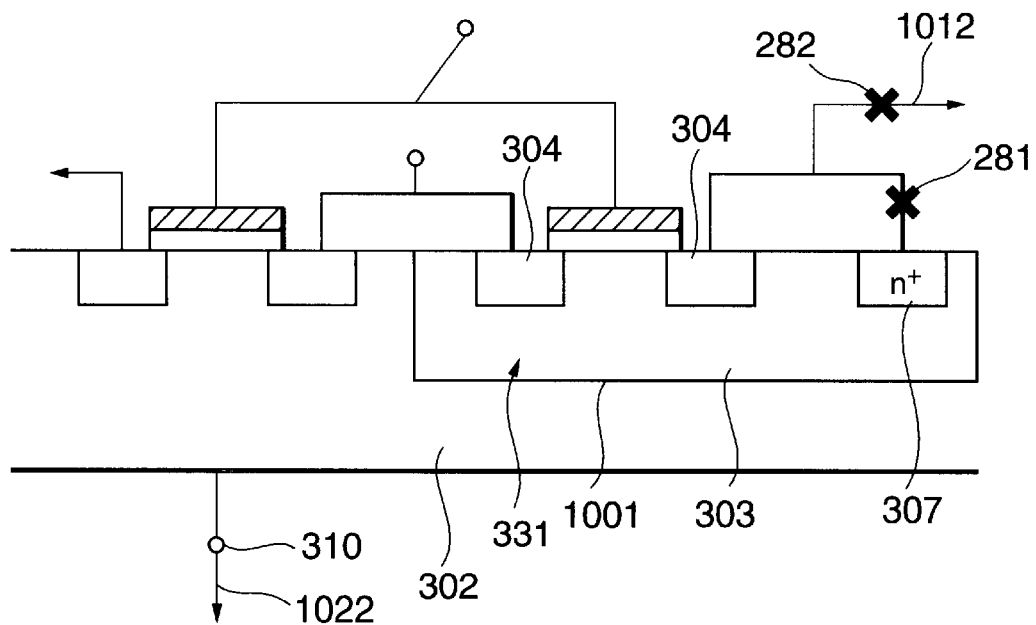

In the second embodiment, a defect is detected in a chip in an installation state in which a chip is installed directly on a circuit substrate without a package. Especially, it shows a case in which a defect is inspected in a chip installed as a free chip. FIG. 6 is a typical chart showing the main configuration of the present embodiment. FIG. 7 shows an example of a defect generated portion of a chip 301 to be analyzed shown in FIG. 6. FIGS. 7(a) and 7(b) are typical sectional views respectively showing a leak defect and a resistance increase defect.

First, the entire configuration is described below by referring to FIG. 6. An example of the configuration of a defective portion of a chip to be analyzed is described by referring to FIG. 7 as necessary. The chip 301 is installed as a bare chip on a is installed as a bare chip on a circuit substrate 401 in a flip chip state, that is, with the chip surface on which a device such as a transistor, etc. is formed facing the circuit substrate 401. In this embodiment, the laser beam 2 enters from the reverse side of the chip 301. When there is resin applied to the reverse side of the chip, it is necessary to expose only the portion on the reverse side of the chip. Furthermore, the convergence of laser beams can be improved by reducing the scattering by grinding the reverse side of the chip, thereby improving the sensitivity and precision of analysis. A number of devices 501 other than a device to be analyzed are provided on the circuit substrate 401. A part of the devices are shown in FIG. 6. In the present embodiment, the target chip 301 can be analyzed independent of a number of other devices and parts on the circuit substrate 401. The practical meaning of the independence of others is that the electrical influence of other devices and parts can be suppressed and they can be protected from destruction or deterioration.

Only the wiring necessary in the explanation is shown in FIG. 6. The necessary wiring includes power source wiring 1012 and wiring 1022 having the same potential as the chip substrate, and is connected between current pickup units 203 and 204. That is, a conductor such as copper wires, etc. not shown in the attached drawings connects C1 with C2. This is only an example, and the wiring is not limited to the set of wiring, and any set of wiring can be acceptable so far as the requirements to configure the following current path and detect the magnetic flux at a part of the current path can be satisfied.

The practical set of the acceptable wiring is described below, and the practical relationship between the defect generated portion and the p-n junction where an OBIC current is generated is described below by referring to the configurations shown in FIGS. 7(*a*) and 7(*b*). FIG. 7(*a*) is a typical sectional view of the structure of the element of the inverter circuit configured by a CMOS for explanation of an example of a leak defect detected in the chip 301 to be analyzed as shown in FIG. 6. The portion of the structure not involved in the explanation is omitted in FIG. 7(*a*). While four short-circuited portions are shown in FIG. 7(*a*), they are not meant to simultaneously occur, but represent four cases of short circuit. That is, any one or more of them can occur.

Described first is the devices configuring the inverter circuit. A chip substrate can be a p-type substrate 302. A p-channel MOS type transistor (hereinafter referred to as a PMOS) 331 is formed in an n-type well 303 formed by an n-type diffused layer, and comprises a p+ diffused area 304 which can be a source and a drain, a gate insulation film 91, and a gate electrode 3101. An n-channel MOS type transistor (hereinafter referred to as an NMOS) 332 comprises an n+ diffused area 305 which can be a source and a drain, a gate insulation film 92, and a gate electrode 3102.

Described below is the process of connecting devices to configure an inverter. An input terminal 311 is connected to both gate electrodes of the NMOS 332 and the PMOS 331. An output terminal 312 is connected to the drain electrode of both transistors. The source of the PMOS 331 is connected to the power source potential wiring 1012 shown in FIG. 6, and the source of the NMOS 332 is connected to a grounding potential terminal 1032 not shown in the attached drawings. The p-type substrate 302 is connected from a substrate potential terminal 310 shown in FIG. 7 to the wiring 1022 shown in FIG. 6. The four leak defects indicate the four cases of defects as described above. For each of the cases, which wirings on the substrate should be paired in order to enable detection of the leak defect will be described below.

(Case 1)
A leak defect 81 occurs when the gate electrode 3101 of the PMOS 331 and the n-type well 303 are short-circuited, that is, when the gate insulation film 91 is short-circuited. In this case, the set of wiring includes the wiring to which the input terminal 311 is connected (not shown in FIG. 6) and the wiring 1022 shown in FIG. 6 to which the substrate potential terminal 310 is connected. In this case, when a leak defect exists, the p-n junction 1001 between the n-type well 303 and the p-type substrate 302 is the generation source of an OBIC current.

(Case 2)
A leak defect 82 occurs when the source electrode of the PMOS 331 and the n-type well 303 are short-circuited. In this case, the set of wiring includes the power source wiring 1012 shown in FIG. 6 to which the source electrode of the PMOS 331 is connected, and the wiring 1022 shown in FIG. 6 to which the substrate potential terminal 310 is connected. That is, the case corresponds to the case shown in FIG. 6. In this case, when a leak defect exists, the p-n junction 1001 between the n-type well 303 and the p-type substrate 302 is the generation source of an OBIC current.

(Case 3)
A leak defect 83 occurs when the gate electrode 3102 of the NMOS 332 and the n+ diffused area 305 are short-circuited. In this case, the set of wiring includes the wiring to which the input terminal 311 is connected (not shown in FIG. 6) and the wiring 1022 shown in FIG. 6 to which the substrate potential terminal 310 is connected. In this case, when a leak defect exists, the p-n junction 1003 between the n+ diffused area 305 and the p-type substrate 302 is the generation source of an OBIC current.

(Case 4)
A leak defect 84 occurs when the gate electrode 3102 and the p-type substrate 302 are short-circuited, that is, when the gate insulation film 92 is short-circuited. In this case, the set of wiring includes the wiring (not shown in FIG. 6) having the same potential as the input terminal 311, and the grounding potential terminal 1032 not shown in the attached drawings. In this case, when a leak defect occurs, the p-n junction 1003 between the n+ diffused area 305 and the p-type substrate 302 is the generation source of an OBIC current.

In the actual CMOS device, in addition to the above mentioned basic circuit configuration, complicated connections can be established such as the connection of the n-type well to the power source potential as shown in the following example. For simple explanation, only the structure related to the explanation is shown, but the application of the laser SQUID is not limited to the cases referred to above.

The case of the resistance increase defect is described below. FIG. 7(*b*) shows an example of a case in which a resistance increase defect has occurred in the chip 301 to be analyzed and shown in FIG. 6, and is a typical sectional view of the structure of the devices in the inverter circuit configured by a CMOS. Since the basic configuration is the same as in the case shown in FIG. 7(*a*), the structure not related to the following explanation is omitted. It is different from the case shown in FIG. 7(*a*) only in that an n+ diffused area 307 is provided in the n-type well 303. The n+ diffused area 307 is connected to the power source wiring 1012. The defect indicates resistance increase defects 281 and 282. The defect corresponds to all resistance increase defects in the current paths from the electrode of the n+ diffused area 307 to the power source wiring 1012. In this case, the power source wiring 1012 shown in FIG. 6 and the wiring 1022 connected to the substrate potential terminal 310 shown in FIG. 6 are paired. That is, this case corresponds to the case shown in FIG. 6. In this case, when there occur the resistance increase defects 281 and 282, the OBIC current flowing when a laser beam is radiated onto the p-n junction 1001 between the n-type well 303 and the p-type substrate 302 is reduced much more than the current there is no defect, or does not flow at all.

According to the present embodiment, two current pickup units 203 and 204 are provided as in the first embodiment as shown in FIG. 6. The positions of the current pickup units 203 and 204 are the points satisfying the following conditions. It is necessary to select a point by trial and error as necessary because there are different sets depending on the point and type of the above mentioned defect, and there may be no correct information about the route on the circuit substrate 401 of the wiring. Regardless of whether it is selected according to correct information or it is selected by trial and error, the following requirements are to be met.

That is, it is necessary to generate a current path by short-circuiting between the current pickup units 203 and 204, that is, between C1 and C2 by a conductor such as copper wires, etc., and by suppressing, as a result of the short circuit, the generation of new magnetic flux which weakens the magnetic flux in the path to be observed. This is similar to the first embodiment. The difference from the first embodiment is a portion where magnetic flux is detected. As in the first embodiment, when the magnetic flux generated from the current path in a chip can be detected, it is accepted. However, if a long substrate wiring exists on the circuit substrate 401 in the current path, and generates magnetic flux, then it is larger and excels in sensitivity. FIG. 6 shows a substrate wiring 402 to be measured, the magnetic flux 11 generated there, and the SQUID fluxmeter 12 for detecting the magnetic flux. It is clear from the explanation above that, if it is possible to measure the current voltage between two terminals of the chip to be analyzed in a normal electric observation in advance, then the OBIC current can be observed by selecting a set having the characteristic of the p-n junction. Additionally, when a magnetic field generated from a current path in a chip can be detected, it is a method of obtaining an immediate effect by short-circuiting the largest possible number of pins.

Figure 8:
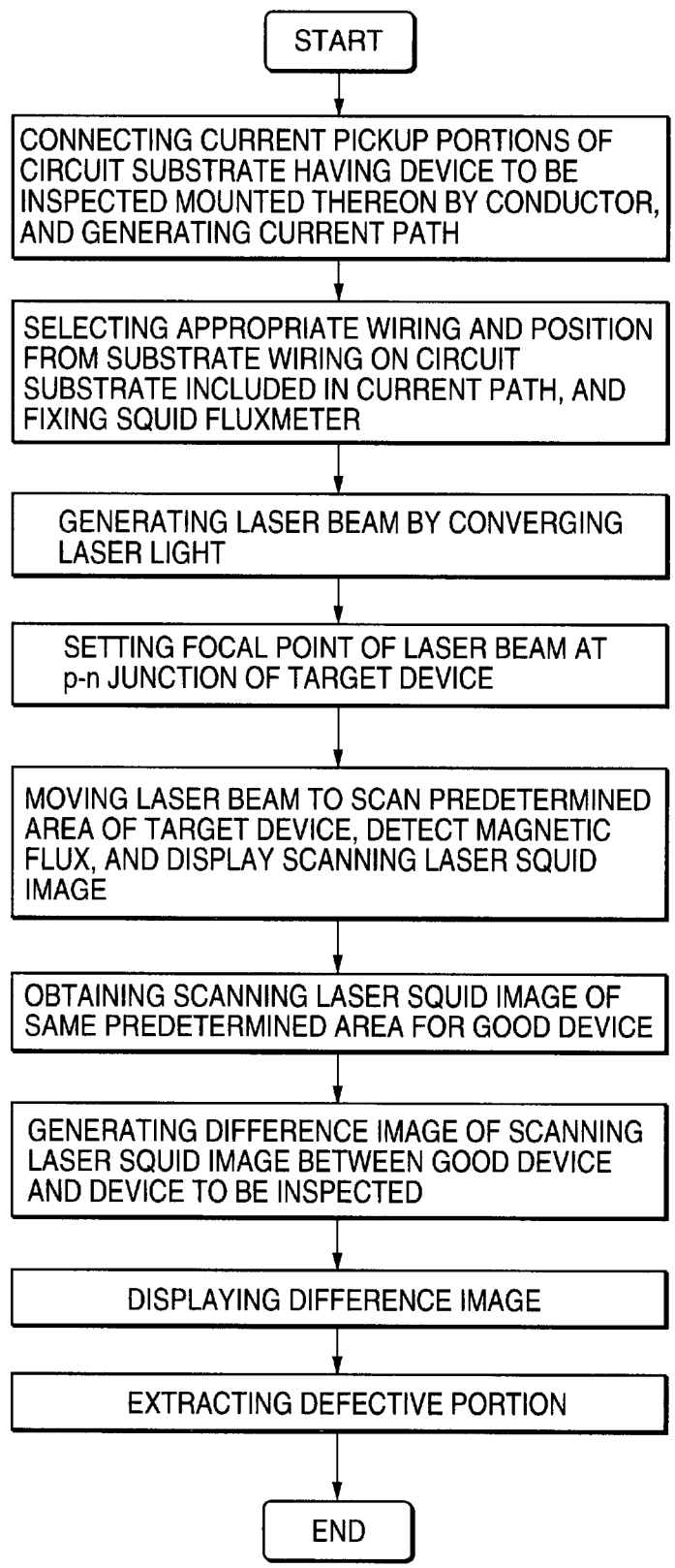
FIG. 8 is a flowchart of the operations according to the second embodiment of the present invention.

The operations according to the second embodiment are described below by appropriately referring to FIGS. 6, 7, 13, and 14 according to the flowchart shown in FIG. 8. In the present embodiment, the details of the items described above are properly omitted for comprehensibility of the flow.

First, the path between the current pickup units 203 and 204 on the circuit substrate 401 is short-circuit by a conductor such as copper wires, etc. not shown in the attached drawings. As described above. In some cases, an immediate effect can be obtained not by selecting the wiring for short circuit but by short-circuiting the largest possible number of wires. Then, in the substrate wiring on the circuit substrate 401 contained in a current path, a portion having a long straight wire, having more magnetic flux generated, and having a detector close to it is selected, and the SQUID fluxmeter 12 is fixed thereto. The SQUID fluxmeter 12 can be fixed close to the chip 301 if necessary. Then, the laser beam 2 is radiated, and the focal point of the laser beam 2 is set to the right surface of the chip 301. If the reverse side of the chip 301 is exposed as in the present embodiment, the laser beam 2 is radiated from the reverse side of the chip 301, and the focal point is set on the right side.

Then, the laser beam 2 is moved to start scanning the chip 301. If the SQUID fluxmeter 12 is fixed around the chip 301, the entire circuit substrate is scanned. If it is effective, it is obvious that the current path formed only inside the chip may work effectively. Simultaneously with the scanning of the chip 301 by the laser beam, the processes of detecting magnetic flux and displaying the detected magnetic flux are started. If a sufficient S/N cannot be obtained by the detected magnetic flux, then the modulation device 52 modulates the intensity of the laser beam, and the lock-in amplifier 55 amplifies the signal, thereby considerably improving the S/N as in the first embodiment. The display position of the detected magnetic flux corresponds to the laser beam radiation position on the chip 301, and the reflected light of the laser beam is detected by a photodiode to be associated with the displayed image (laser scanned image), thereby obtaining an OBIC current generated position as described above. For visibility of the OBIC current generated position, the image according to the present invention can be overlapped and displayed with the laser scanned image as described above.

By recognizing the OBIC current generated position in a chip unit, a defective chip can be detected, and the useful information about exchanging chips can be obtained. Thus, the cost can be much reduced as compared with the case in which the entire board is discarded. Furthermore, it is effective from the viewpoint of effective utilization of resources. Additionally, by recognizing the detailed position inside a chip, a defective and fault analysis can be performed to obtain the information for a chip manufacturer improving the production or design. The problems in an installing method can also be detected, thereby possibly improving the installing process.

The spatial resolution of an image according to the present invention and a laser scanned image is approximately the beam diameter of a laser beam as described above. As mentioned above, it is not technologically difficult to enlarge the beam diameter of a laser beam up to the upper diffraction limit depending on the wavelength of the laser light and the numerical aperture of the objective. Since an observation is made from the reverse side in the present embodiment, the wavelength is different from that in the above mentioned case. For example, if the YAG laser having a wavelength of 1,064 nm is used, and the numerical aperture of the objective is 0.80, then the diffraction limit is about 810 nm. With the precision, an OBIC current generation source can be specified.

It is not simple as described above to obtain the relationship between the existence of a defect and the existence of a generated OBIC current. Therefore, as in the first embodiment, by comparison with a scanning laser SQUID image for a good product obtained in advance, a scanning laser SQUID image in a normal state, or a standard obtained based on them, the position of a defect can be identified. For easier comparison, a difference image can be generated as shown in the final step of the flow.

Then, the third embodiment of the present invention is described below in detail by referring to the attached drawings.

The third embodiment relates to the case in which a defect on a chip is detected using a TEG. Using a TEG, a configuration can be freely set. Therefore, the present embodiment is variable. Typical examples are shown here, but it is obvious that the present invention is not limited to these examples.

Figure 9:
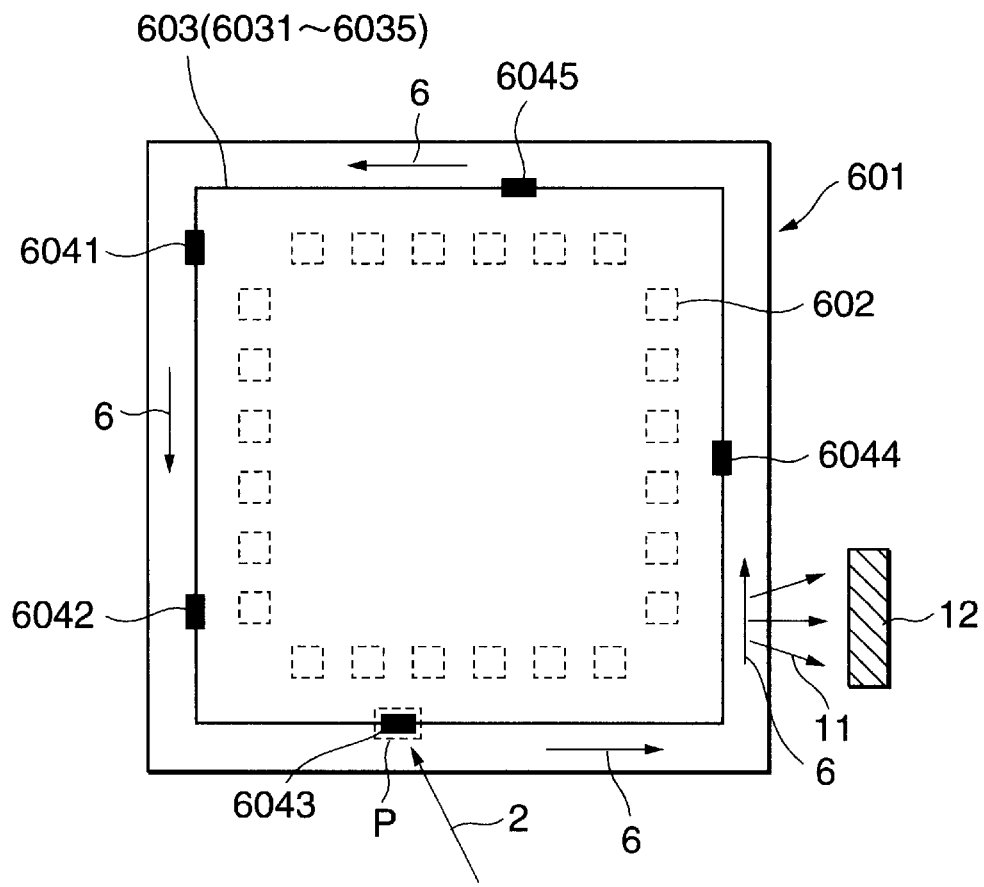
FIGS. 9(a) and 9(b) show the third embodiment of the present invention.
Figure 9:
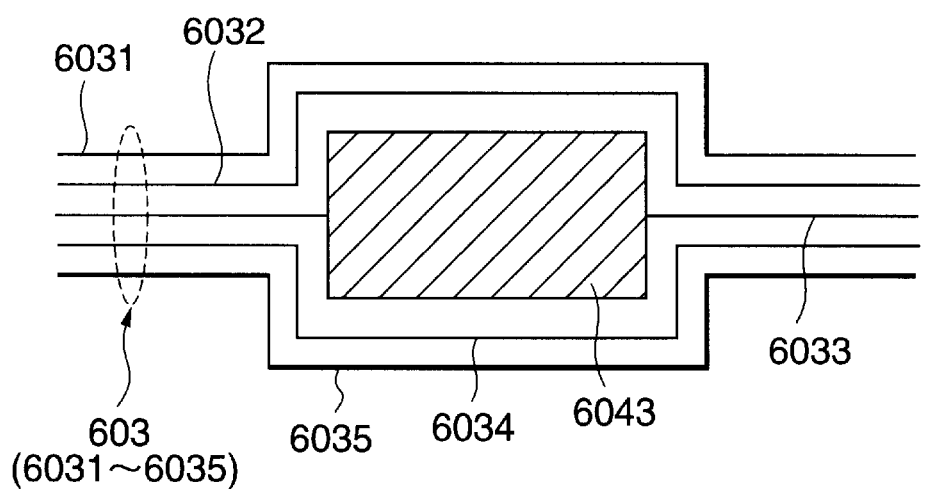
Figure 10:
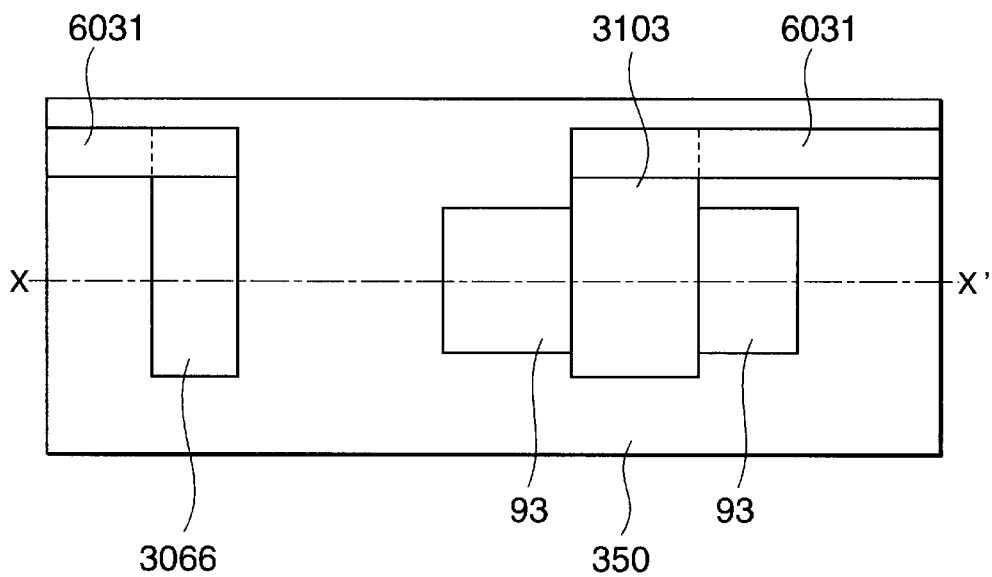
FIGS. 10(a) and 10(b) show an example of a TEG block to be analyzed.
Figure 10:
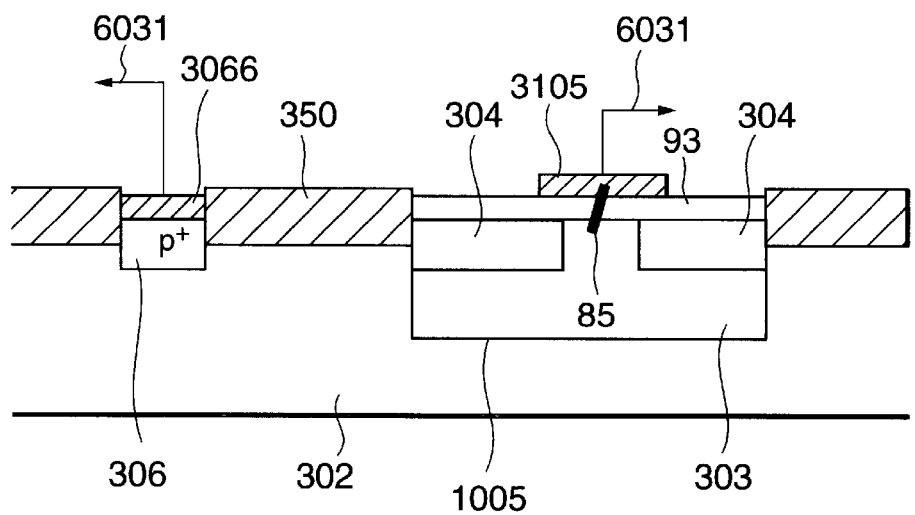
Figure 11:
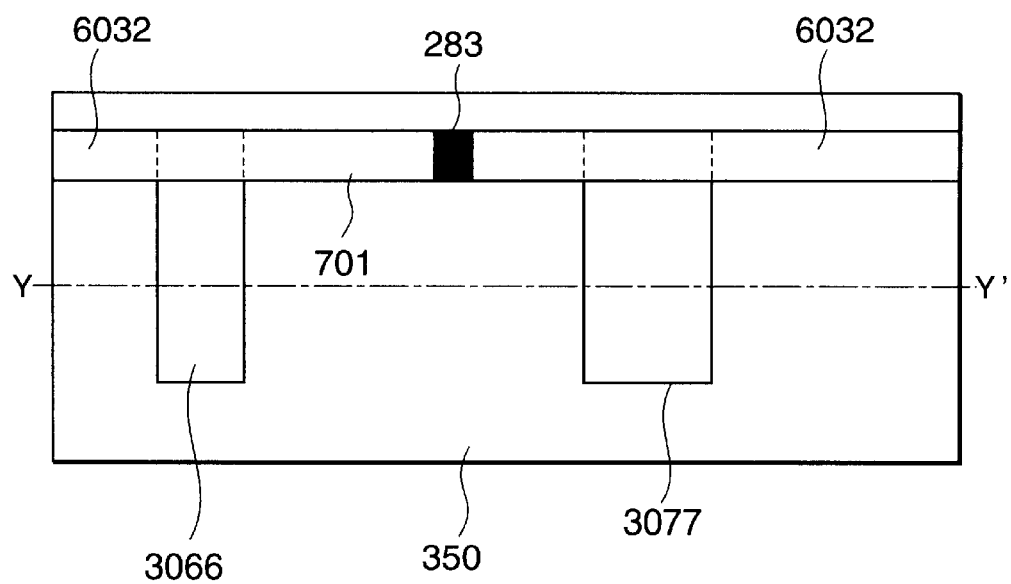
FIGS. 11(a) and 11(b) show an example of a TEG block to be analyzed.
Figure 11:
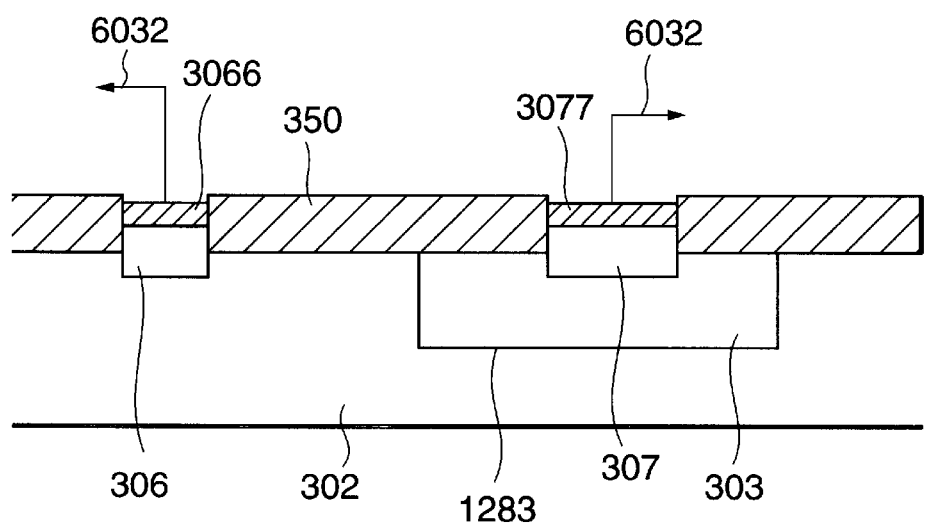

FIG. 9 is a typical view showing the main configuration of the third embodiment of the present invention. That is, FIG. 9(a) is a plan view, and FIG. 9(b) is an enlarged plan view of the portion P shown in FIG. 9(a). FIGS. 10 and 11 show examples of the configurations of the TEG block to be analyzed and shown in FIG. 9.

The entire configuration is described first by referring to FIG. 9. In the description, an example of a configuration of a TEG block to be analyzed is explained by appropriately referring to FIGS. 10 and 11. TEG blocks 6041 to 6045 to be analyzed are provided as surrounding all of a plurality of bonding pads 602. The laser beam 2 can enter both from right and reverse sides of a chip. To input the laser beam from the reverse side and provide the SQUID fluxmeter 12 on the right side allows a current path to be close to the SQUID fluxmeter 12, and generates larger magnetic flux. However, in this case, it is necessary to use a laser beam having a longer wavelength, which is a disadvantage in spatial resolution.

According to the present embodiment, the current pickup units required as necessary in the first and second embodiments are not required. That is, a wiring 603 for a produced current path for connecting both ends of the TEG block to be analyzed is produced in advance to encompass a bonding pad. Instead of connecting both ends of the TEG block to be analyzed only with wiring, a circuit for connecting a capacitance and a resistor in series with the TEG block to be analyzed can be formed. In the following explanation, a case in which a current path for connecting p-n junctions only with wiring is formed is explained, but the present invention is not limited to this application. This current path is produced for each TEG block to be analyzed. It bypasses another TEG block to be analyzed. Since the width of the wiring can be minimized based on the process precision, no large space is occupied. This is shown in FIG. 9(b). Both ends of the TEG block 6043 to be analyzed are connected by the wiring 6033 for a produced current path. Other wiring 6031, 6032, 6034, and 6035 for a produced current path bypass the TEG block 6043. The wiring 603 for a produced current path represents all of the wirings 6031 to 6035 for a produced current path. Since the magnetic flux 11 generated from the current path is generated anywhere around a chip, the SQUID fluxmeter 12 can be provided anywhere around the chip.

An example of the configuration of a TEG block to be analyzed is described below by referring to FIGS. 10 and 11. FIG. 10 shows the configuration of the TEG block provided for detecting a leak defect. That is, FIG. 10(a) is a plan view, and FIG. 10(b) is a sectional view along X–X' shown in FIG. 10(a). FIG. 11 shows the configuration of the TEG block provided for detecting a disconnection defect. That is, FIG. 11(a) is a plan view, and FIG. 11(b) is a sectional view along Y–Y' shown in FIG. 11(a). The structure not relating to the explanation is omitted.

A case of a leak defect is described below by referring to FIG. 10. The p-type substrate 302 comprises a field oxide film 350 and then-type well 303, and units up to a gate electrode 3103 of the p-channel MOS transistor are formed in the n-type well 303. A gate insulation film 93 is provided all over the top surface of the n-type well 303. The gate electrode 3103 passes the center of the top surface of the n-type well 303, and is connected to one end of the wiring 6031 for a produced current path. The p+ diffused area 306 formed to be connected to the p-type substrate 302 is connected to the other end of the wiring 6031 for a produced current path through the p+ diffused area pick up electrode 3066. The wiring 6031 for a produced current path for connecting the gate electrode 3103 to the p+ diffused area pickup electrode 3066 encompasses the chip between the bonding pad 602 and the end portion of the chip as shown in FIG. 9. Only when a leak defect 85 shown in FIG. 10 short-circuits the gate electrode 3103 and the n-type well 303, a current path is configured through the p-n junction 1005 between the n-type well 303 and the p-type substrate 302, and an OBIC current flows when a laser beam is radiated onto a p-n junction 1005. Thus, the leak defect 85 can be detected.

A case of a resistance increase defect is described below by referring to FIG. 11. An internal wiring 701 to be inspected of a TEG block 6042 provided for detecting a resistance increase defect is connected to both ends of a p-n junction 1283 through the p+ diffused area pickup electrode 3066 and a n+ diffused area pickup electrode 3077. Thus, the internal wiring 701 to be inspected short-circuits both ends of the p-n junction 1283. Furthermore, parallel to the internal wiring 701 to be inspected, the wiring 6032 for a produced current path encompassing the chip is connected to both ends of the p-n junction 1283 (also refer to FIG. 9(a)). With the above mentioned configuration, an OBIC current generated by the p-n junction 1283 by the radiation of a laser beam flows along the wiring 6032 for a produced current path when a resistance increase defect 283 occurs, and the magnetic flux generated by the current is detected by the SQUID fluxmeter 12 (FIG. 9(a)). When the resistance increase defect 283 does not exist, such an OBIC current flows mainly through the internal wiring 701 having small resistance to be inspected, and only a slight current flows through the wiring 6032 for a produced current path having comparatively large resistance. Since the current flowing through the wiring 6032 for a produced current path increases when the resistance increase defect 283 exists, the detected magnetic flux largely depends on whether or not a defect exists. Therefore, it can be determined whether or not a resistance increase defect exists.

Figure 12:
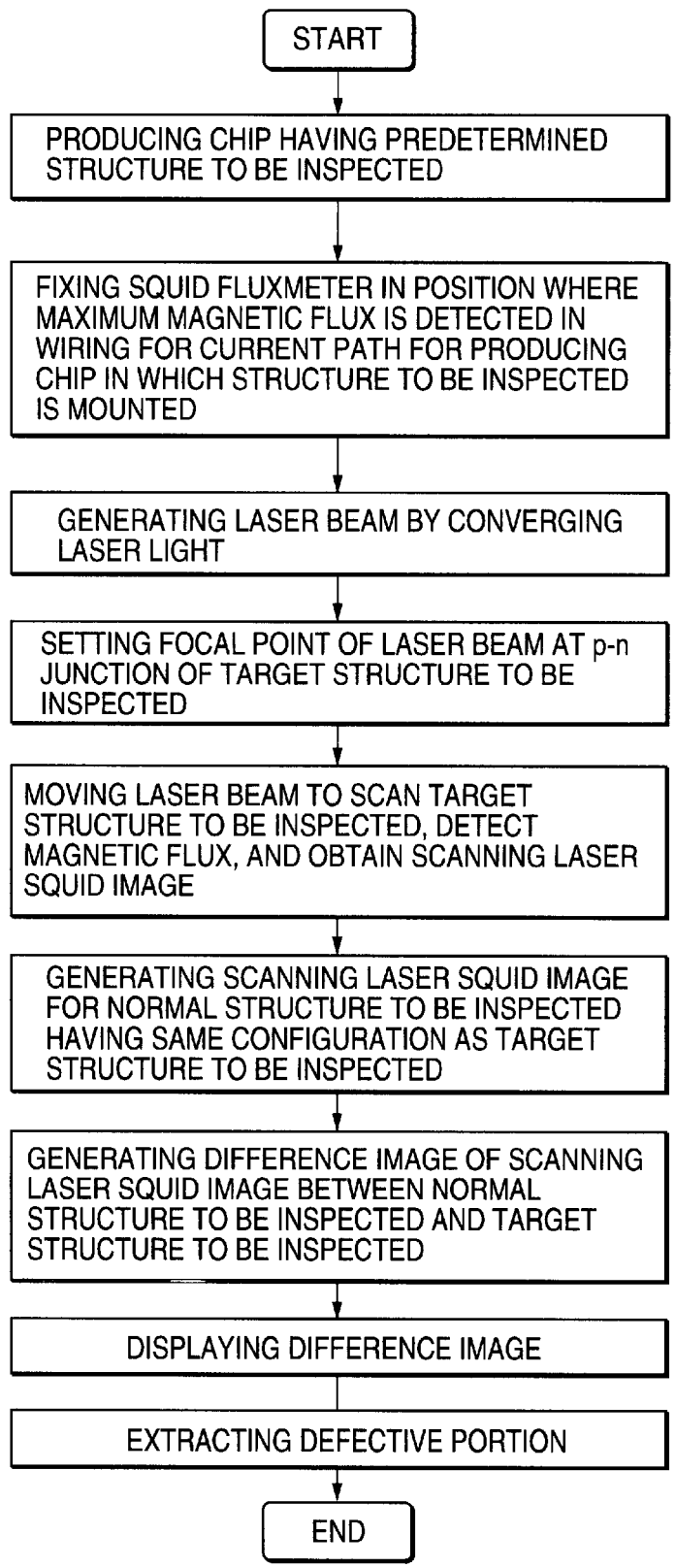
FIG. 12 is a flowchart of the operations according to the third embodiment of the present invention.

The operations according to the third embodiment are described below according to the flowchart shown in FIG. 12 by referring to FIGS. 9, 10, and 11. The details of the items described above are appropriately omitted here for comprehensibility of the entire flow.

First, the SQUID fluxmeter 12 is fixed on the wiring 603 for a produced current path on the chip 601 by the second fixing means not shown in the attached drawings. The position where the SQUID fluxmeter 12 is fixed is the position where the detected magnetic flux indicates the largest possible value. This position is obtained by roughly shifting it in the direction vertical to the wiring 603 for a produced current path by the distance h between the chip surface and the magnetic flux detected surface of the SQUID fluxmeter. The correct position is, for example, determined by actually measuring the portion corresponding to the resistance increase defect 283 of the internal wiring 701 to be inspected shown in FIG. 11 using a sample disconnected by the FIB.

Then, the laser beam 2 is radiated, and the focal point of the laser beam is set to the right surface of the chip 601. When the laser beam can be radiated both from right and reverse sides of the chip 601, the laser beam 2 is radiated from the reverse side and the focal point is set on the right side. This is advantageous in the intensity of a detected magnetic flux. On the other hand, from the viewpoint of the spatial resolution, the radiation onto the right surface is advantageous because the wavelength of the laser beam 2 can be shortened.

Then, the scanning is started by the laser beam 2. The chip 601 can be moved. However, in this case, it is necessary to fix the relative position between the SQUID fluxmeter 12 and the chip 601. Normally, it is easier to move the laser beam 2. However, if the scanning range is large, the laser beam 2 cannot be easily moved. Therefore, the chip 601 may be more easily moved. The relative scanning of the chip 601 by the laser beam 2 is performed on the TEG block unit to be analyzed regardless of whether the laser beam 2 is moved or the chip 601 is moved. Therefore, it is more efficient than the method according to the first and second embodiments. When the scanning is performed by the laser beam 2, magnetic flux is detected and displayed. When a sufficient S/N cannot be obtained using the detected flux, the laser beam 2 is modulated by the modulation device 52 as shown in FIG. 14, and the signal is amplified by the lock-in amplifier 55, thereby considerably improving the S/N as in the first and second embodiments.

A detected magnetic flux display position corresponds to the laser beam radiation position on the chip 601, the reflected light of a laser beam is detected by the photodiode, and is associated with the displayed image (laser scanned image). Thus, the OBIC current generated position can be obtained as in the first and second embodiments.

For visibility of the OBIC current generated position, the scanning laser SQUID image according to the present invention is overlapped and displayed with the laser scanned image as in the first and second embodiments. With the configuration in which a fault mode and mechanism is limited for each TEG block, an OBIC current generation block is recognized in a TEG block unit to obtain the information about a defective mode or mechanism without a physical analysis. In addition, by statistically analyzing a result in a chip unit or a wafer unit, effective unit for the lot and wafer can be obtained without producing the process steps up to the final step. The spatial resolution of an image according to the present invention and a laser scanned image is described in the first and second embodiments, and the explanation is omitted here.

Furthermore, effective information can be obtained by comparison with a scanning laser SQUID image for a good product obtained in advance or a scanning laser SQUID image as described in the first and second embodiments, the detailed explanation is omitted here. However, the present embodiment is advantageous over the other embodiments in that a TEG can be designed such that the comparison with an image in a normal state or the scanning laser SQUID image for a good product is not required.

As described above, according to the present invention, an electrically active defect causing a defect and a fault such as a resistance increase defect including a disconnection and a leak including a short circuit can be detected without destruction and touching, and without waiting for a bonding pad to be formed. Therefore, at a stage during the semiconductor chip preprocessing step, a completely non-touching and non-destructive inspection can be carried out on an electrically active defect, and an appropriate action relating to the yield and reliability of a product can be obtained.

Furthermore, after forming a bonding pad, a defect can be detected without destruction or touching without considering the combination of electric connections by making simple preparations such as covering a chip with thin gold film, applying silver paste to the chip, or attaching a socket with all pins short-circuited by soldering, etc. As a result, after the preprocess, a more efficient inspection than the conventional method can be carried out.

Additionally, without giving an influence to or receiving it from other devices or parts on the installed circuit substrate, only a defect of a target chip can be detected without destruction or touching. Therefore, a more efficient inspection than the conventional method can be carried out on a packaged chip.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A non-destructive inspection method, comprising:
    a first step of generating a laser light ranging in wavelength from 300 nm to 1,200 nm, and generating a laser beam converging into a predetermined beam diameter;
    a second step of predetermined electrical connection means configuring of a predetermined current path for passing an OBIC (Optical Beam Induced Current) current generated by an OBIC phenomenon when the laser beam is radiated onto a p-n junction and vicinity of the p-n junction formed in a semiconductor chip to be inspected at least in a substrate including a wafer state and an installation state during a production process;
    a third step of scanning a predetermined area of a semiconductor chip while radiating the laser beam;
    a fourth step of magnetic flux detection means detecting magnetic flux induced by the OBIC current generated by the laser beam at each radiation point scanned in the third step; and
    a fifth step of determining whether or not there is a resistance increase defect including a disconnection defect or a leak defect including a short circuit defect in the current path including the radiation point of said semiconductor chip based on said magnetic flux detected in the fourth step.

2. The non-destructive inspection method according to claim 1, wherein
    said current path includes a CR delay circuit comprising a capacitance C including a parasitic capacitance and a floating capacitance, and a resistor R including a parasitic resistor.

3. The non-destructive inspection method according to claim 1, wherein
    in said second step, said electrical connection means is a current path including parasitic ones produced into the semiconductor chip having at least one contact hole in a diffused layer area forming a p-n junction in the substrate, in particular, a conductive film applied to an entire top surface of the substrate.

4. The non-destructive inspection method according to claim 1, wherein
    it is determined in said fifth step that there is a leak defect including a short circuit defect in said current path containing the radiation point when the magnetic flux detected in said fourth step is equal to or larger than a predetermined standard value at the radiation point where no current path is configured for the OBIC current in a good product or in a normal state.

5. The non-destructive inspection method according to claim 1, wherein
    it is determined in said fifth step that there is a resistance increase defect including a disconnection defect in said current path containing the radiation point when the magnetic flux detected in said fourth step is smaller than a predetermined standard value at the radiation point where a current path is configured for the OBIC current in a good product or in a normal state.

6. The non-destructive inspection method according to claim 1, further comprising
a step of the laser beam scanning the semiconductor chip with relative position relationship fixed between a radiation point where a laser beam is most limited and said magnetic flux detection means for detecting the magnetic flux.

7. The non-destructive inspection method according to claim 1, further comprising
a step of relatively scanning between said magnetic flux detection means and a semiconductor chip with a laser beam and the semiconductor chip relatively fixed.

8. The non-destructive inspection method according to claim 1, wherein
said connection means connects a first end portion provided for a conductive film applied to an entire top surface of a substrate on which a p-n junction of a semiconductor chip is formed with a second end portion provided as an OBIC current pickup portion at a reverse surface opposed to the upper surface of the substrate.

9. The non-destructive inspection method according to claim 8, wherein
said second end portion is provided in an area not containing said first end portion halved by an area division line normal to a line passing a central point of a plane of the substrate, and connecting the central point with said first end point.

10. The non-destructive inspection method according to claim 3, wherein
said conductive film applied to the entire top surface of the substrate of the semiconductor chip is film applied during a production process.

11. The non-destructive inspection method according to claim 1, wherein
said semiconductor chip to be inspected is a wafer, and said current path of the OBIC current is configured by containing the semiconductor chip and a prover.

12. The non-destructive inspection method according to claim 1, wherein
a bonding pad or a vamp of the semiconductor chip to be inspected is connected with a chip external pickup lead, and at least one of a right and a reverse side of the chip is exposed, and the current path of the OBIC current contains the semiconductor chip and the lead of a package.

13. The non-destructive inspection method according to claim 1, wherein
said semiconductor chip to be inspected is installed on a circuit substrate independently or with other devices, and the current path of the OBIC current is independently formed in the semiconductor chip, or contains the semiconductor chip and the circuit substrate.

14. The non-destructive inspection method according to claim 13, wherein
said current path has two portions on the circuit substrate short-circuited by a predetermined connection means such that generated magnetic flux cannot offset each other.

15. The non-destructive inspection method according to claim 13, wherein
said magnetic flux detection means is fixed to a portion where generated magnetic flux cannot offset each other in the current path on the circuit substrate so that the semiconductor chip to be inspected is scanned by the laser beam.

16. The non-destructive inspection method according to claim 1, wherein
said semiconductor chip to be inspected completely includes a target area and the current path in the semiconductor chip.

17. The non-destructive inspection method according to claim 1, wherein
a semiconductor chip to be inspected is provided with a bonding pad, and said current path encompasses the semiconductor chip between the bonding pad and a brim portion of the semiconductor chip.

18. The non-destructive inspection method according to claim 1, wherein
said magnetic flux detection means is configured by a superconducting quantum interference device.

19. The non-destructive inspection method according to claim 18, wherein
said superconducting quantum interference device is a high temperature superconducting type of DC superconducting quantum interference device.

20. The non-destructive inspection method according to claim 18, further comprising:
a seventh step of generating intensity information or color information corresponding to magnetic flux at each radiation point detected in said fourth step, and storing the information together with coordinate information about each radiation point in storage means; and
a eighth step of displaying an image of a predetermined area of the semiconductor chip according to the intensity information or the color information corresponding to each of said radiation points.

21. A non-destructive inspection method for each of a first semiconductor chip and a second semiconductor chip including a wafer state and an installation state to be inspected, comprising:
a first step of generating a laser light ranging in wavelength from 300 nm to 1,200 nm, and generating a laser beam converging into a predetermined beam diameter;
a second step of predetermined electrical connection means configuring of a predetermined current path for passing an OBIC (Optical Beam Induced Current) current generated by an OBIC phenomenon when the laser beam is radiated onto a p-n junction and vicinity of the p-n junction formed in a substrate of a relevant semiconductor chip to be inspected;
a third step of scanning a predetermined area of said relevant semiconductor chip while radiating the laser beam;
a fourth step of magnetic flux detection means detecting magnetic flux induced by an OBIC current generated by the laser beam at each radiation point scanned in the third step;
a fifth step of determining whether or not there is a resistance increase defect including a disconnection defect or a leak defect including a short circuit defect in the current path including the radiation point of said semiconductor chip based on said magnetic flux detected in the fourth step;
a seventh step of converting and generating into intensity information or color information based on magnetic flux at each radiation point, and storing the information together with coordinate information about each radiation point in storage means;
a ninth step of generating and storing difference image information according to the intensity information or color information, first image information about the first semiconductor chip, and second image information about the second semiconductor chip containing the coordinate information about the radiation point; and a tenth step of displaying the difference image information.

22. The non-destructive inspection method according to claim 21, wherein said first semiconductor chip and said second semiconductor chip are different chips having a same configuration, at least one of which is a good chip, and predetermined areas thereof scanned by the radiating laser beam have the same configuration.

23. The non-destructive inspection method according to claim 21, wherein said first semiconductor chip and said second semiconductor chip are same chips and have same predetermined areas scanned by the radiating laser beam, and an electrical state of one of the predetermined areas is normal, and an electrical state of the other is an inspection state.

* * * * *